(12) United States Patent
Kim et al.

(10) Patent No.: US 12,289,947 B2
(45) Date of Patent: Apr. 29, 2025

(54) ELECTRONIC DEVICE INCLUDING A SUPPORT

(71) Applicant: SAMSUNG DISPLAY CO., LTD., Yongin-si (KR)

(72) Inventors: Yun-Ho Kim, Hwaseong-si (KR); Chul Kim, Hwaseong-si (KR); Jaeuk Choi, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 258 days.

(21) Appl. No.: 17/659,447

(22) Filed: Apr. 15, 2022

(65) Prior Publication Data
US 2023/0006173 A1 Jan. 5, 2023

(30) Foreign Application Priority Data
Jul. 2, 2021 (KR) .................. 10-2021-0087409

(51) Int. Cl.
| | | |
|---|---|---|
| H10K 50/844 | (2023.01) | |
| H10K 59/40 | (2023.01) | |
| G06F 3/044 | (2006.01) | |
| H10K 50/115 | (2023.01) | |
| H10K 59/122 | (2023.01) | |
| H10K 102/00 | (2023.01) | |

(52) U.S. Cl.
CPC ........... *H10K 50/844* (2023.02); *H10K 59/40* (2023.02); *G06F 3/0446* (2019.05); *H10K 50/115* (2023.02); *H10K 59/122* (2023.02); *H10K 2102/311* (2023.02)

(58) Field of Classification Search
CPC .... H10K 50/844; H10K 59/40; H10K 50/115; H10K 59/122; H10K 2102/311; H10K 77/10; G06F 3/0446; G06F 1/1616; G06F 1/1641; G06F 1/1652; G06F 2203/04102; G06F 3/0412; G06F 3/0416; H04M 1/0268; G09F 9/301
See application file for complete search history.

(56) References Cited

U.S. PATENT DOCUMENTS

| | | | |
|---|---|---|---|
| 7,084,933 B2 | 8/2006 | Oh et al. | |
| 10,054,466 B2 | 8/2018 | Matsumoto | |
| 10,845,696 B2* | 11/2020 | Song | H04N 9/3173 |
| 10,866,618 B2* | 12/2020 | Yeom | G06F 1/1618 |
| 2021/0263563 A1* | 8/2021 | Tsuchihashi | G06F 1/1652 |
| 2021/0280806 A1* | 9/2021 | Park | H10K 50/841 |
| 2023/0113544 A1* | 4/2023 | Ha | H05K 5/0018 |
| | | | 428/138 |
| 2023/0209741 A1* | 6/2023 | Choi | B32B 3/08 |
| | | | 361/807 |
| 2023/0297132 A1* | 9/2023 | Kishimoto | G06F 1/1616 |
| | | | 361/679.01 |

FOREIGN PATENT DOCUMENTS

| | | |
|---|---|---|
| KR | 101728806 | 4/2017 |
| KR | 10-2021-0016983 | 2/2021 |

\* cited by examiner

*Primary Examiner* — Kevin Quarterman
(74) *Attorney, Agent, or Firm* — F. CHAU & ASSOCIATES, LLC

(57) ABSTRACT

An electronic device includes a display panel, an input sensor disposed on the display panel, and a support disposed under the display panel to support the display panel. The support includes a first portion and a second portion surrounding the first portion. The second portion is provided with a plurality of first openings defined therethrough.

24 Claims, 17 Drawing Sheets

ELECTRONIC DEVICE INCLUDING A SUPPORT

CROSS-REFERENCE TO RELATED APPLICATION

This U.S. non-provisional patent application claims priority under 35 U.S.C. § 119 to Korean Patent Application No. 10-2021-0087409, filed on Jul. 2, 2021, the contents of which are hereby incorporated by reference in its entirety.

TECHNICAL FIELD

The present disclosure relates to an electronic device. More particularly, the present disclosure relates to an electronic device including a support.

2. DESCRIPTION OF THE RELATED ART

Multimedia electronic devices, such as televisions, mobile phones, tablet computers, vehicle navigation units, and game consoles, include an electronic device to display images. The electronic device often include an input sensor that provides a touch-based input method allowing users to easily and intuitively input information or commands to the electronic device, in addition to the usual input methods, such as a button, a keyboard, a mouse, etc.

The input sensor senses a touch or pressure generated by a user such as by a user's finger or stylus. In particular, the use of a stylus is of particular interest to users who are familiar with inputting information using a writing instrument or for specific application programs (e.g., for sketching or drawing application programs) that require detailed and precise touch input.

SUMMARY

An electronic device includes a display panel, an input sensor disposed on the display panel, and a support disposed under the display panel to support the display panel. The support includes a first portion and a second portion at least partially surrounding the first portion. The second portion is provided with a plurality of first openings defined therethrough.

The display panel may include a folding area and a non-folding area. The support may include a bending area overlapping the folding area and a non-bending area overlapping the non-folding area. The first portion and the second portion may each be disposed in the non-bending area.

The support may further include a third portion disposed in the bending area and provided with a plurality of second openings defined therethrough.

The first openings may each have a shape that is the same as a shape of the second openings.

The second portion may have a width that is the same as a width of the third portion.

The second portion may include first and second edges disposed substantially parallel to the third portion, disposed at sides opposite to each other, and symmetrical to each other. The second portion may further include third and fourth edges disposed substantially perpendicular to the third portion, disposed at sides opposite to each other, and symmetrical to each other.

The first openings may be defined through at least a portion of the first edge, the second edge, the third edge, and the fourth edge.

The support may include a non-metal material having an electrical conductivity that is lower than an electrical conductivity of a metal material.

The first openings may have different shapes from each other and may be irregularly arranged.

The electronic device may further include a driving circuit electrically connected to the input sensor to drive the input sensor, and at least a portion of the second portion may be disposed farther from the driving circuit than the first portion is.

The support may include a metal material.

The input sensor may be disposed directly on the display panel.

The first openings may be defined through the first portion.

A density of the first openings in the first portion may be smaller than a density of the first openings in the second portion.

An electronic device includes a display panel, an input sensor disposed on the display panel, a driving circuit connected to a first side of the input sensor to drive the input sensor, and a support disposed under the display panel and including a first portion and a second portion at least partially surrounding the first portion. The second portion includes a first area adjacent to the first side and a second area that is not adjacent to the first side. A plurality of first openings is defined in the second area.

The second area may be disposed farther from the driving circuit than the first area is.

The display panel may include a folding area and a non-folding area. The support may include a bending area overlapping the folding area and a non-bending area overlapping the non-folding area. The support may further include a third portion disposed in the bending area and provided with a plurality of second openings defined therethrough.

The second portion may have a width that is greater than a width of the third portion.

The first openings may have different shapes from each other and may be irregularly arranged.

The input sensor may be disposed directly on the display panel, and the support may entirely overlaps the input sensor.

An electronic device includes a display panel, a support disposed under the display panel, and an input sensor disposed between the display panel and the support. Wherein a plurality of opening is defined within an edge of the support.

The support may include a plurality of edges and the plurality of openings may be defined within each of the plurality of edges of the support.

The plurality of openings may be defined within an entirety of the support.

The support may be metal.

BRIEF DESCRIPTION OF THE DRAWINGS

The above and other aspects of the present disclosure will become readily apparent by reference to the following detailed description when considered in conjunction with the accompanying drawings, wherein.

DETAILED DESCRIPTION

In the present disclosure, it will be understood that when an element or layer is referred to as being "on", "connected to" or "coupled to" another element or layer, it can be directly on, connected or coupled to the other element or layer or intervening elements or layers may be present.

Like numerals may refer to like elements throughout the specification and the drawings. As used herein, the term "and/or" includes any and all combinations of one or more of the associated listed items.

It will be understood that, although the terms first, second, etc. may be used herein to describe various elements, these elements should not necessarily be limited by these terms. These terms are used to distinguish one element from another element. Thus, a first element discussed below could be termed a second element without departing from the teachings of the present disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as illustrated in the figures.

It will be further understood that the terms "comprise," "comprising," "includes," and/or "including", when used in this specification, specify the presence of stated features, integers, steps, operations, elements, and/or components, but do not preclude the presence or addition of one or more other features, integers, steps, operations, elements, components, and/or groups thereof.

Hereinafter, the present disclosure will be explained in detail with reference to the accompanying drawings.

Figure 1A:
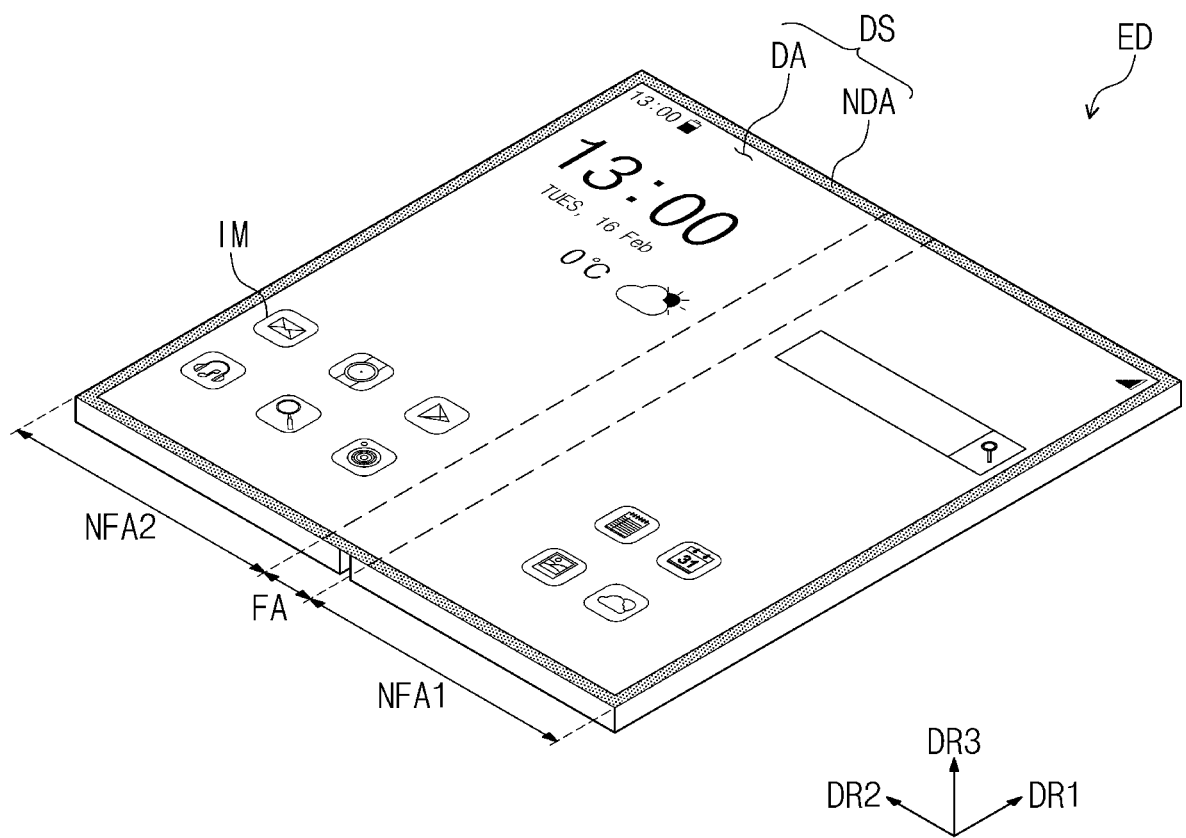
FIGS. 1A and 1B are perspective views showing an electronic device according to an embodiment of the present disclosure.
Figure 1B:
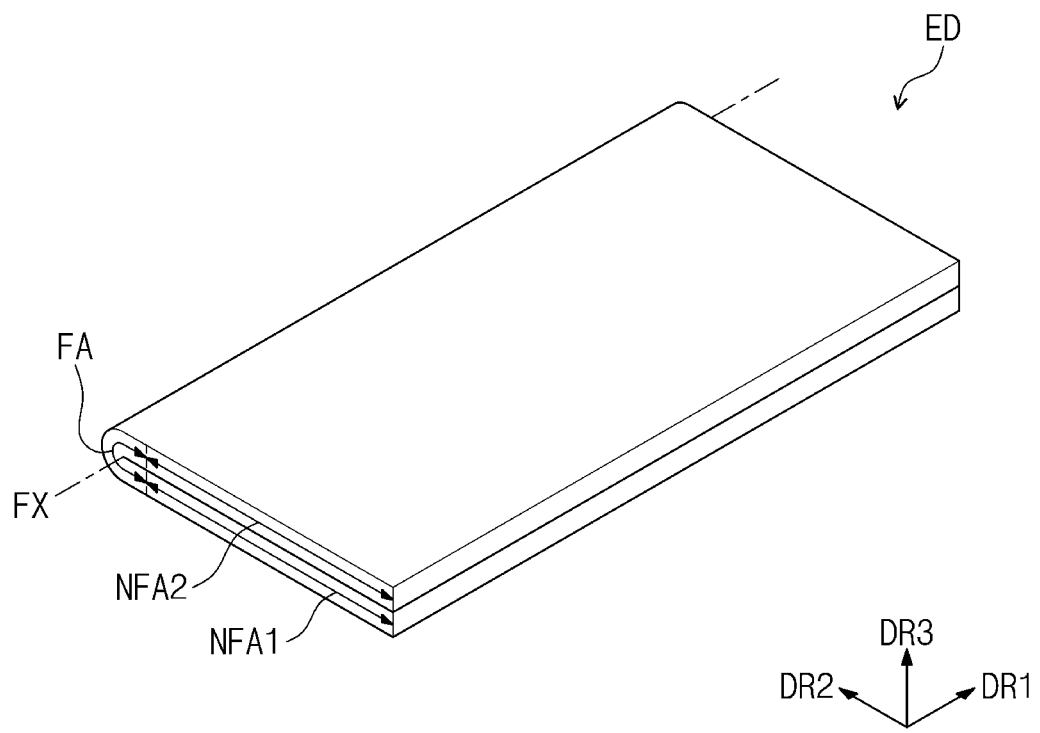

FIGS. 1A and 1B are perspective views showing an electronic device ED according to an embodiment of the present disclosure.

FIG. 1A shows an unfolded state of the electronic device ED, and FIG. 1B shows a folded state of the electronic device ED.

Referring to FIGS. 1A and 1B, the electronic device ED may be activated in response to various electrical signals. The electronic device ED may be a mobile phone, a foldable mobile phone, a tablet computer, a car navigation unit, a game console, or a wearable device, however, the present invention is not necessarily limited thereto or thereby. FIGS. 1A and 1B show the foldable mobile phone as the electronic device ED as a representative example, however, the electronic device ED is not necessarily limited to the foldable mobile phone.

The electronic device ED may include a display surface DS defined by a first direction DR1 and a second direction DR2 crossing the first direction DR1. The electronic device ED may provide an image IM to a user through the display surface DS.

The display surface DS may include a display area DA and a non-display area NDA at least partially surrounding the display area DA. The display area DA may display the image IM, and the non-display area NDA might not display the image IM. The non-display area NDA may surround the display area DA. However, the present invention is not necessarily limited thereto or thereby, and the shape of the display area DA and the shape of the non-display area NDA may be changed.

Hereinafter, a direction substantially perpendicular to a plane defined by the first direction DR1 and the second direction DR2 may be referred to as a third direction DR3. In the present disclosure, the expression "when viewed in a plane" or "in a plan view" may mean a state of being viewed from the third direction DR3.

The electronic device ED may include a folding area FA (or a foldable area) and a plurality of non-folding areas NFA1 and NFA2. The non-folding areas NFA1 and NFA2 may include a first non-folding area NFA1 and a second non-folding area NFA2. The folding area FA may be disposed between the first non-folding area NFA1 and the second non-folding area NFA2. The first non-folding area NFA1, the folding area FA, and the second non-folding area NFA2 may be sequentially defined in the electronic device ED along the second direction DR2.

As shown in FIG. 1B, the folding area FA may be folded with respect to a folding axis FX that extends substantially parallel to the first direction DR1. The folding area FA may extend in the first direction DR1. The folding area FA may be folded to have a predetermined curvature and a radius of curvature. The electronic device ED may be inwardly folded (inner-folding) such that the first non-folding area NFA1 faces the second non-folding area NFA2 and the display surface DS is not exposed to the outside when in a folded state.

According to an embodiment, the electronic device ED may be outwardly folded (outer-folding) such that the display surface DS is exposed to the outside when in a folded state. According to an embodiment, the electronic device ED may be provided such that the inner-folding operation and an unfolding operation are repeated or the outer-folding operation and the unfolding operation are repeated, however, the present invention is not necessarily limited thereto or thereby. According to an embodiment, the electronic device ED may be provided to carry out any one of the unfolding operation, the inner-folding operation, and the outer-folding operation.

Figure 2:
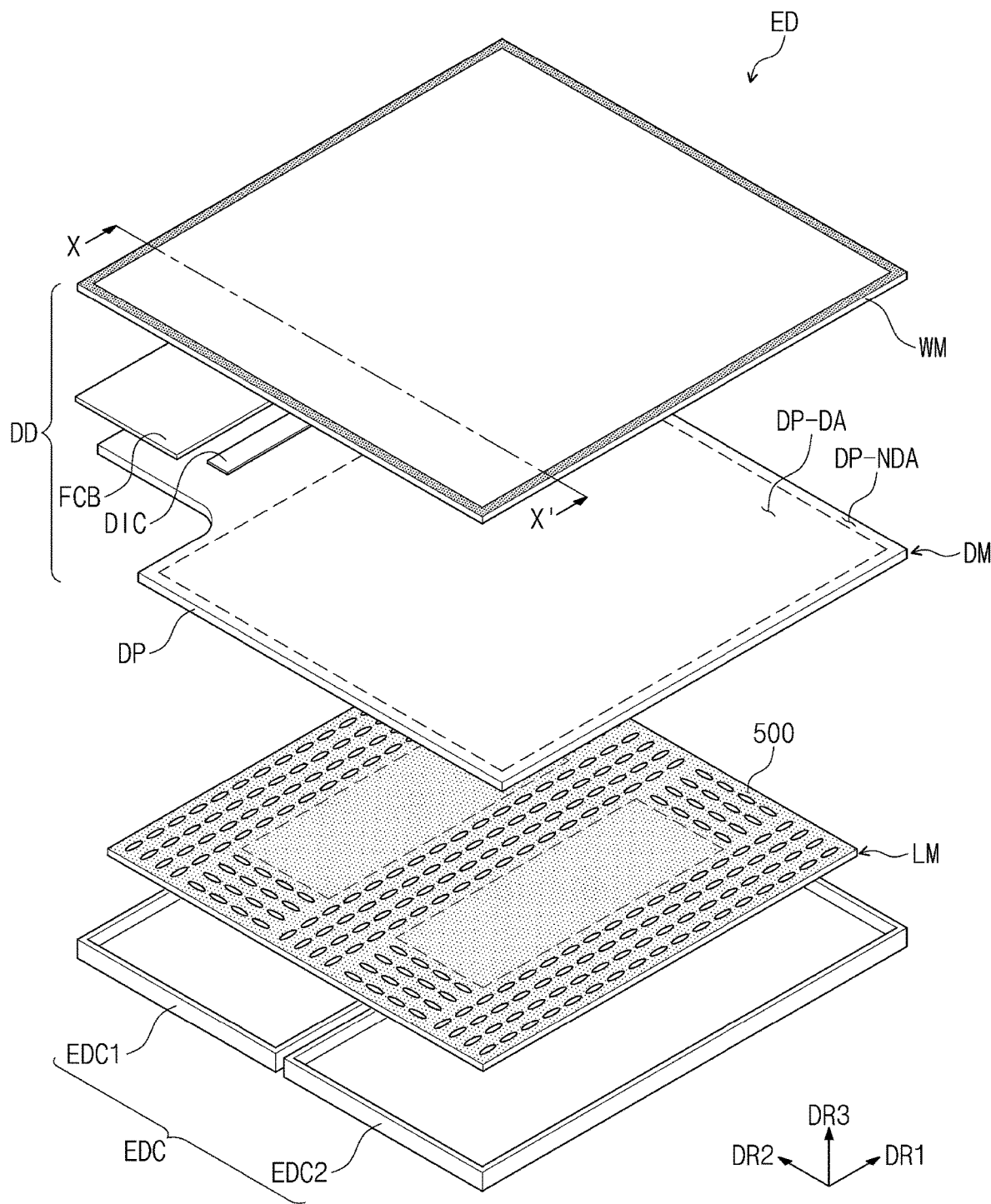
FIG. 2 is an exploded perspective view showing an electronic device according to an embodiment of the present disclosure.

FIG. 2 is an exploded perspective view showing the electronic device ED according to an embodiment of the present disclosure.

Referring to FIG. 2, the electronic device ED may include a display device DD, a lower layer LM, and cases EDC1 and EDC2.

The display device DD may generate an image and may sense an external input. The display device DD may include a window module WM and a display module DM. The window module WM may form a front surface of the electronic device ED.

The display module DM may include at least a display panel DP. In FIG. 2, although the display module DM is shown as same as the display panel DP, the display module DM may have a stack structure in which plural components are stacked one on another. As an example, the display module DM may further include an input sensor. Detailed descriptions on the stack structure of the display module DM will be described later.

The display panel DP may include a display area DP-DA and a non-display area DP-NDA, which respectively correspond to the display area DA (refer to FIG. 1A) and the non-display area NDA (refer to FIG. 1A) of the electronic device ED. In the present disclosure, the expression "an area/portion corresponds to another area/portion" means that "an area/portion overlaps another area/portion" and one or more edges may also overlap, however, the "areas and portions" should not necessarily be limited to having the same size and/or shape as each other.

The display module DM may include a driving chip DIC disposed in the non-display area DP-NDA. The display module DM may further include a circuit film FCB coupled with the non-display area DP-NDA.

The driving chip DIC may include driving elements to drive pixels of the display panel DP, e.g., a data driving circuit. FIG. 2 shows a structure in which the driving chip DIC is mounted on the display panel DP, however, the present disclosure should not necessarily be limited thereto or thereby. As an example, the driving chip DIC may be mounted on the circuit film FCB.

The lower layer LM may include a support structure 500 and a protective layer 600. The lower layer LM may support the display module DM and may protect the display module DM from external impacts. The lower layer LM may further include functional layers in addition to the support structure 500 and the protective layer 600. As an example, the lower layer LM may include a heat dissipation layer.

According to an embodiment, the support structure 500 may include a metal plate. The support structure 500 may be provided with a plurality of openings defined therethrough. Each of these openings may be a through-hole fully penetrating the support structure 500. The protective layer 600 may include a protective film and a cushion layer. This will be described in detail later.

The cases EDC1 and EDC2 may accommodate the display module DM and the lower layer LM. Two cases EDC1 and EDC2 spaced apart from each other are shown, however, the cases should not necessarily be limited thereto or thereby. The electronic device ED may further include a hinge structure to connect the two cases EDC1 and EDC2 to each other. Each of the cases EDC1 and EDC2 may be coupled with the window module WM. The cases EDC1 and EDC2 may protect not only the display module DM but also components accommodated in the cases EDC1 and EDC2.

Figure 3:
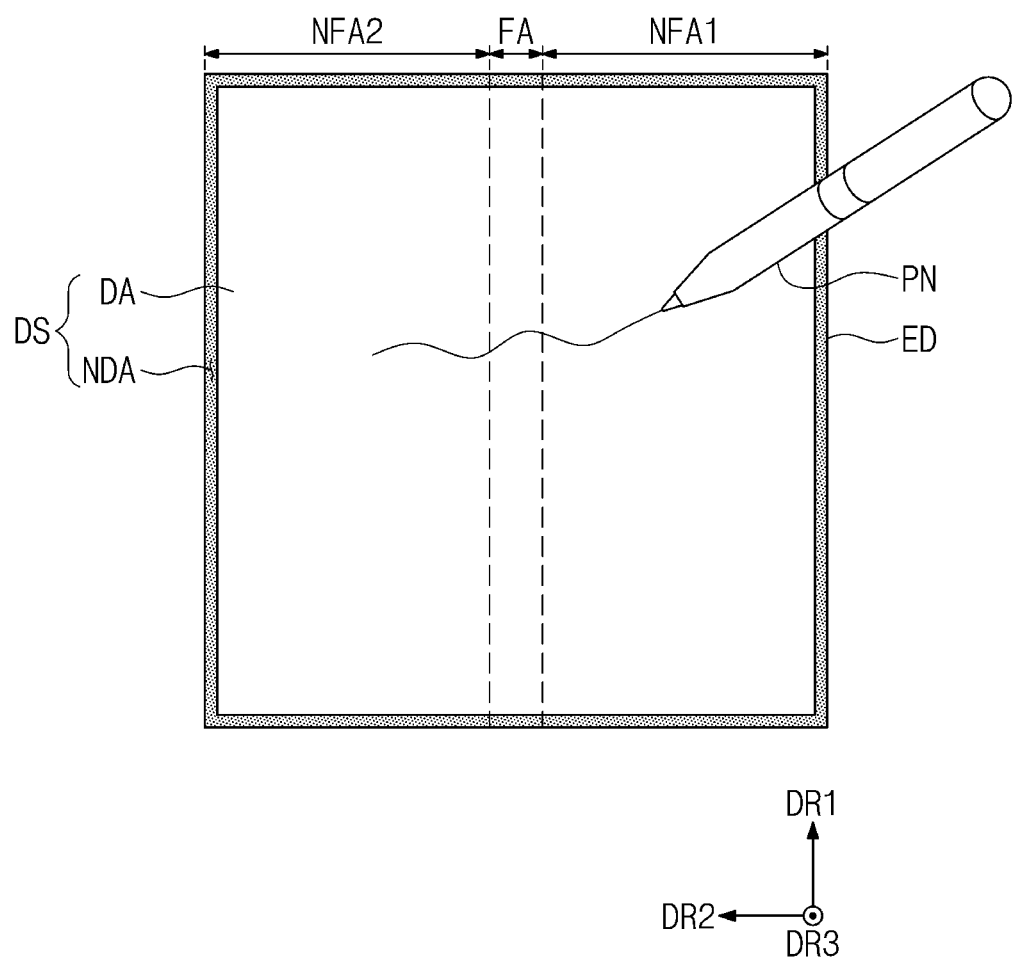
FIG. 3 is a plan view showing an electronic device according to an embodiment of the present disclosure.

FIG. 3 is a plan view showing the electronic device ED according to an embodiment of the present disclosure.

Referring to FIG. 3, the electronic device ED may include an input device PN. The electronic device ED according to the present embodiment may be referred to as an electronic system, a touch system, an input/output system, a digitizer system, a pen tablet, or a pen terminal.

The input device PN may be a device that generates a magnetic field of a predetermined resonant frequency. The input device PN may be configured to transmit an output signal based on an electromagnetic resonance method. The input device PN may be referred to as a pen, an input pen, a magnetic pen, a stylus, or an electromagnetic resonance pen.

The input device PN may include a signal generator that generates an alternating current power therein. In this case, the input device PN may generate an induced current using an internal signal generator even though there is no external magnetic field provided from the outside. Accordingly, although the electronic device ED does not include a digitizer that forms an electric field, the electronic device ED may sense an input from the input device PN that outputs the electric field.

The input device PN driven by the electromagnetic resonance method has a better output efficiency than that of an active electrostatic pen (hereinafter, referred to as an AES pen). As an example, when a Tx signal (input signal) applied to the input device PN and a Tx signal applied to the AES pen have the same frequency, e.g., about 1.8 MHz, and the same input voltage, e.g., about 17V, an intensity of a signal output from the input device PN may be about 40 times stronger than an intensity of a signal output from the AES pen. In addition, an intensity of an output signal from the input device PN when the Tx signal having a frequency of about 1.8 MHz and a voltage of about 1V is applied to the input device PN may be similar to an intensity of an output signal from the AES pen when the Tx signal having a frequency of about 1.8 MHz and a voltage of about 17V is applied to the AES pen. Accordingly, the input device PN operated in an active mode may consume less battery power than the AES pen.

In addition, in a case where the input device PN is applied to the electronic device ED, the electronic device ED might not include the digitizer. Accordingly, an increase in thickness and weight and a decrease in flexibility of the electronic device ED due to the addition of the digitizer may be prevented. The electronic device ED from which the digitizer is omitted may sense the input from the input device PN using the input sensor IS (refer to FIG. 4).

Figure 4:
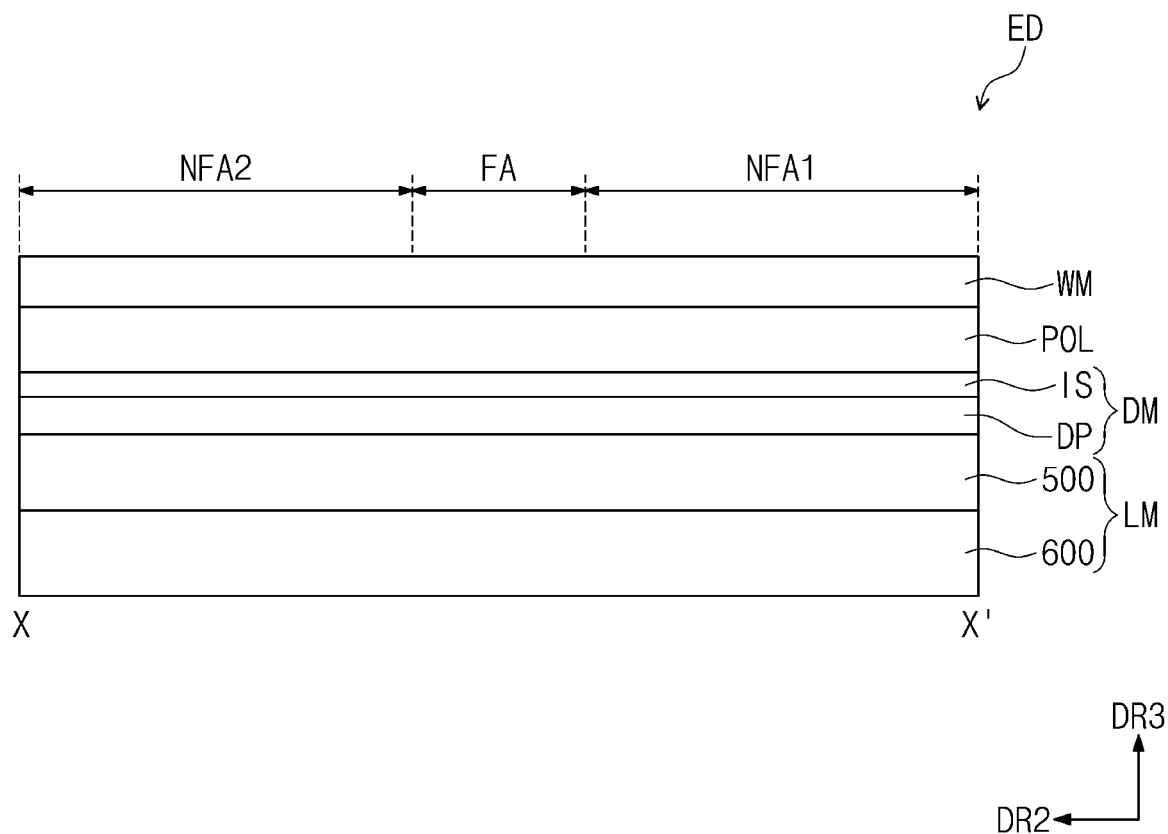
FIG. 4 is a cross-sectional view showing an electronic device according to an embodiment of the present disclosure.

FIG. 4 is a cross-sectional view showing the electronic device ED according to an embodiment of the present disclosure. FIG. 4 shows a cross-section taken along a line X-X' of FIG. 2.

Referring to FIG. 4, the electronic device ED may include the window module WM, an anti-reflective layer POL, the display module DM, the support structure 500, and the protective layer 600.

The display module DM may display the image IM (refer to FIG. 1A) and may sense the input device PN (refer to FIG. 3) outside the display module DM. The input device PN may provide various types of external inputs, such as a part of a user's body, light, heat, or pressure, or a combination thereof.

The display module DM may include the display panel DP generating the image IM and the input sensor IS sensing the external input.

The display panel DP may be a light-emitting type display panel, however, the present invention should not necessarily be limited to this particular arrangement. For instance, the display panel DP may be an organic light emitting display panel or a quantum dot light emitting display panel. A light emitting layer of the organic light emitting display panel may include an organic light emitting material. A light emitting layer of the quantum dot light emitting display panel may include a quantum dot or a quantum rod.

The input sensor ISP may be disposed directly on the display panel DP. As an example, the input sensor ISP may be formed on the display panel DP through successive processes. The input sensor IS may include a plurality of insulating layers and a plurality of conductive layers. The conductive layers may form a sensing electrode sensing the external input, a sensing line connected to the sensing electrode, and a sensing pad connected to the sensing line. The input sensor IS may sense the external input using a mutual capacitance method and/or a self-capacitance method. However, a method of sensing the external input should not necessarily be limited thereto or thereby.

The input sensor IS may be operated in a first touch mode to sense the input based on a variation of capacitance and a second touch mode to sense the input by (the electronic pen) input device PN that emits a magnetic field. For example, the display module DM that does not include the digitizer may sense not only the input generated by the user's touch but also the input generated by (the electronic pen) input device PN using the input sensor IS.

The display module DM may include a folding area FA, a first non-folding area NFA1, and a second non-folding area NFA2. The first non-folding area NFA1 may correspond to the first non-folding area NFA1 of FIG. 1A, the folding area FA may correspond to the folding area FA of FIG. 1A, and the second non-folding area NFA2 may correspond to the second non-folding area NFA2 of FIG. 1A.

The anti-reflective layer POL may be disposed on the display module DM. The anti-reflective layer POL may reduce a reflectance of the external light incident thereto from the outside. The anti-reflective layer may include a retarder and a polarizer. The retarder may be a film type or liquid crystal coating type and may include a half-wave ($\lambda/2$) retarder and/or a quarter-wave ($\lambda/4$) retarder. The polarizer may also be a film type or liquid crystal coating type. The film type polarizer and the film type retarder may include a stretching type synthetic resin film, and the liquid crystal coating type polarizer and the liquid crystal coating type retarder may include liquid crystals aligned in a predetermined alignment. The retarder and the polarizer may further include a protective film.

According to an embodiment, the anti-reflective layer POL may include color filters. The color filters may be arranged in a predetermined arrangement. The arrangement of the color filters may be determined by taking into account emission colors of the pixels included in the display panel DP. The anti-reflective layer POL may further include a black matrix disposed adjacent to the color filters.

According to an embodiment, the anti-reflective layer POL may include a destructive interference structure. For instance, the destructive interference structure may include a first reflection layer and a second reflection layer, which are disposed on different layers from each other. A first reflection light and a second reflection light, which are reflected by the first reflection layer and the second reflection layer, respectively, may be destructively interfered, and thus, the reflectance of the external light may be reduced. An adhesive layer may be disposed between the anti-reflective layer POL and the display module DM. Adhesive layers described in the present disclosure may include a conventional adhesive. As an example, each adhesive layer may include a pressure sensitive adhesive (PSA), an optical clear adhesive (OCA), or an optical clear resin (OCR). The adhesive layer may be omitted.

The window module WM may be disposed on the anti-reflective layer POL. The window module WM may include a glass substrate and/or a synthetic resin film. As an example, the window module WM may include a polyimide film. The window module WM should not necessarily be limited to a single-layer structure. The window module WM may include two or more films attached to each other by an adhesive. An adhesive layer may be disposed between the window module WM and the anti-reflective layer POL, however, according to an embodiment, the adhesive layer may be omitted.

The support structure 500 may be disposed under the display module DM. The support structure 500 may support a rear surface of the display module DM. The support structure 500 may include a metal material. For example, the support structure 500 may be the metal plate. For example, the support structure 500 may include one or more metal plates. In the present embodiment, the metal material may include SS (stainless steel). According to an embodiment, the support structure 500 may include a material having an electrical conductivity lower than that of the metal material. As an example, the support structure 500 may include a plastic material containing polyimide (PI).

The protective layer 600 may be disposed under the support structure 500. The protective layer 600 may protect the display module DM from external impacts. The protective layer 600 may include the protective film and the cushion layer. The protective film may include a synthetic resin film, e.g., a polyimide film or a polyethylene terephthalate film. The cushion layer may include a sponge, a foam, or a urethane resin.

Figure 5:
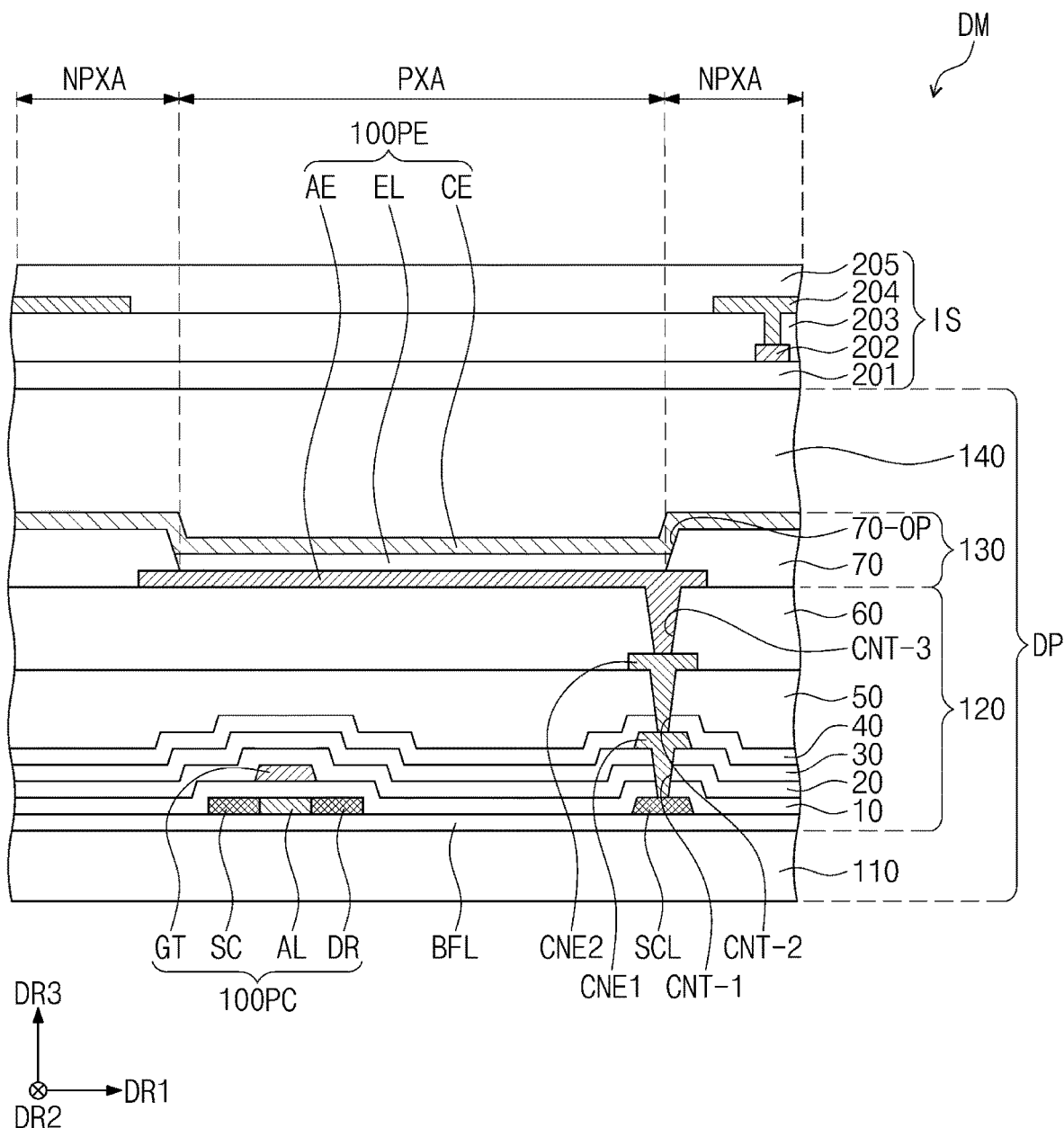
FIG. 5 is a cross-sectional view showing a display module according to an embodiment of the present disclosure.

FIG. 5 is a cross-sectional view showing the display module DM according to an embodiment of the present disclosure.

Referring to FIG. 5, the display panel DP may include a base layer 110, a circuit layer 120, a light emitting element layer 130, and an encapsulation layer 140.

The base layer 110 may provide a base surface on which the circuit layer 120 is disposed. The base layer 110 may be a glass substrate, a metal substrate, or a polymer substrate. However, the embodiment should not necessarily be limited thereto or thereby, and the base layer 110 may be an inorganic layer, an organic layer, or a composite material layer.

The base layer 110 may have a multi-layer structure. For instance, the base layer 110 may include a first synthetic resin layer, a silicon oxide (SiOx) layer disposed on the first synthetic resin layer, an amorphous silicon (a-Si) layer disposed on the silicon oxide layer, and a second synthetic resin layer disposed on the amorphous silicon layer. The silicon oxide layer and the amorphous silicon layer may be referred to as a base barrier layer.

Each of the first and second synthetic resin layers may include a polyimide-based resin. In addition, each of the first and second synthetic resin layers may include an acrylic-based resin, a methacrylic-based resin, a polyisoprene-based resin, a vinyl-based resin, an epoxy-based resin, a urethane-based resin, a cellulose-based resin, a siloxane-based resin, a polyamide-based resin, and/or a perylene-based resin. In the present disclosure, the term "X-based resin", as used herein, refers to the resin that includes a functional group of X.

At least one inorganic layer may be formed on an upper surface of the base layer 110. The inorganic layer may include aluminum oxide, titanium oxide, silicon oxide, silicon nitride, silicon oxynitride, zirconium oxide, and/or hafnium oxide. The inorganic layer may be formed in multiple layers. The inorganic layers formed in multiple layers may form a barrier layer and/or a buffer layer. In the present embodiment, the display panel DP may include a buffer layer BFL.

The buffer layer BFL may increase a coupling force between the base layer 110 and a semiconductor pattern. The buffer layer BFL may include silicon oxide, silicon nitride, and/or silicon oxynitride. As an example, buffer layer BFL may have a structure in which a silicon oxide layer and a silicon nitride layer are alternately stacked with each other.

The semiconductor pattern may be disposed on the buffer layer BFL. The semiconductor pattern may include polysilicon, however, it should not necessarily be limited thereto or thereby. The semiconductor pattern may include amorphous silicon, low-temperature polycrystalline silicon, or oxide semiconductor.

FIG. 5 shows only a portion of the semiconductor pattern, and the semiconductor pattern may be further disposed in other areas. The semiconductor pattern may be arranged with a specific rule over the pixels. The semiconductor pattern may have different electrical properties depending on whether it is doped or not or whether it is doped with an N-type dopant or a P-type dopant. The semiconductor pattern may include a first region with a relatively high conductivity and a second region with a relatively low conductivity. The first region may be doped with the N-type dopant or the P-type dopant. A P-type transistor may include a doped region doped with the P-type dopant, and an N-type transistor may include a doped region doped with the N-type dopant. The second region may be a non-doped region or may be doped at a concentration lower than the high conductivity region.

The first region may have a conductivity greater than that of the second region and may substantially serve as an electrode or a signal line. The second region may substantially correspond to an active area of a transistor. For example, a portion of the semiconductor pattern may be the active area of the transistor, another portion of the semiconductor pattern may be a source area or a drain area of the transistor, and the other portion of the semiconductor pattern may be a connection electrode or a connection signal line.

Each of the pixels may have an equivalent circuit that includes seven transistors, one capacitor, and a light emitting element, and the equivalent circuit of the pixels may be changed in various ways. FIG. 5 shows one transistor 100PC and the light emitting element 100PE included in the pixel.

The source area SC, the active area AL, and the drain area DR of the transistor 100PC may be formed from the semiconductor pattern. The source area SC and the drain area DR may extend in opposite directions to each other from the active area AL in a cross-section. FIG. 5 shows a portion of a connection signal line SCL formed from the semiconductor pattern. The connection signal line SCL may be connected to the drain area DR of the transistor 100PC.

A first insulating layer 10 may be disposed on the buffer layer BFL. The first insulating layer 10 may commonly overlap the pixels and may cover the semiconductor pattern. The first insulating layer 10 may be an inorganic layer and/or an organic layer and may have a single-layer or multi-layer structure. The first insulating layer 10 may include aluminum oxide, titanium oxide, silicon oxide, silicon nitride, silicon oxynitride, zirconium oxide, and/or hafnium oxide. In the present embodiment, the first insulating layer 10 may have a single-layer structure of a silicon oxide layer. Not only the first insulating layer 10, but also an insulating layer of the circuit layer 120 described later may be an inorganic layer and/or an organic layer and may have a single-layer or multi-layer structure. The inorganic layer may include one or more of the above-mentioned materials, however, it should not necessarily be limited thereto.

A gate GT of the transistor 100PC may be disposed on the first insulating layer 10. The gate GT may be a portion of a metal pattern. The gate GT may overlap the active area AL. The gate GT may be used as a mask in a process of doping the semiconductor pattern.

A second insulating layer 20 may be disposed on the first insulating layer 10 and may cover the gate GT. The second insulating layer 20 may commonly overlap the pixels. The second insulating layer 20 may be an inorganic layer and/or an organic layer and may have a single-layer or multi-layer structure. The second insulating layer 20 may include silicon oxide, silicon nitride, and/or silicon oxynitride. In the present embodiment, the second insulating layer 20 may have a multi-layer structure of a silicon oxide layer and a silicon nitride layer.

A third insulating layer 30 may be disposed on the second insulating layer 20. The third insulating layer 30 may have a single-layer structure or a multi-layer structure. As an example, the third insulating layer 30 may have the multi-layer structure of a silicon oxide layer and a silicon nitride layer.

A first connection electrode CNE1 may be disposed on the third insulating layer 30. The first connection electrode CNE1 may be connected to the connection signal line SCL via a contact hole CNT-1 defined through the first, second, and third insulating layers 10, 20, and 30.

A fourth insulating layer 40 may be disposed on the third insulating layer 30. The fourth insulating layer 40 may have a single-layer structure of a silicon oxide layer. A fifth insulating layer 50 may be disposed on the fourth insulating layer 40. The fifth insulating layer 50 may be an organic layer.

A second connection electrode CNE2 may be disposed on the fifth insulating layer 50. The second connection electrode CNE2 may be connected to the first connection electrode CNE1 via a contact hole CNT-2 defined through the fourth insulating layer 40 and the fifth insulating layer 50.

A sixth insulating layer 60 may be disposed on the fifth insulating layer 50 and may cover the second connection electrode CNE2. The sixth insulating layer 60 may be an organic layer.

The light emitting element layer 130 may be disposed on the circuit layer 120. The light emitting element layer 130 may include the light emitting element 100PE. For example, the light emitting element layer 130 may include an organic light emitting material, a quantum dot, a quantum rod, a micro-LED, or a nano-LED. Hereinafter, the organic light emitting element will be described as the light emitting element 100PE, however, the light emitting element should not necessarily be particularly limited thereto.

The light emitting element 100PE may include a first electrode AE, a light emitting layer EL, and a second electrode CE.

The first electrode AE may be disposed on the sixth insulating layer 60. The first electrode AE may be connected to the second connection electrode CNE2 via a contact hole CNT-3 defined through the sixth insulating layer 60.

A pixel definition layer 70 may be disposed on the sixth insulating layer 60 and may cover a portion of the first electrode AE. An opening 70-OP may be defined through the pixel definition layer 70. At least a portion of the first electrode AE may be exposed through the opening 70-OP of the pixel definition layer 70.

The display area DA (refer to FIG. 1A) may include a light emitting area PXA and a non-light-emitting area NPXA adjacent to the light emitting area PXA. The non-light-emitting area NPXA may at least partially surround the light emitting area PXA. In the present embodiment, the light emitting area PXA may be defined to correspond to the portion of the first electrode AE, which is exposed through the opening 70-OP.

The light emitting layer EL may be disposed on the first electrode AE. The light emitting layer EL may be disposed in an area corresponding to the opening 70-OP. For example, the light emitting layer EL may be formed in each of the pixels after being divided into plural portions. In the case where the light emitting layer EL is formed in each of the pixels after being divided into plural portions, each of the light emitting layers EL may emit light having a blue, red, or green color, however, it should not necessarily be limited thereto or thereby. According to an embodiment, the light emitting layer EL may be commonly provided over the pixels without being divided into plural portions. In this case, the light emitting layer EL may provide a blue light or a white light.

The second electrode CE may be disposed on the light emitting layer EL. The second electrode CE may have an integral shape (e.g., may be one continuous and uninterrupted structure) and may be commonly disposed over the pixels.

A hole control layer may be disposed between the first electrode AE and the light emitting layer EL. The hole control layer may be commonly disposed in the light emitting area PXA and the non-light-emitting area NPXA. The hole control layer may include a hole transport layer and may further include a hole injection layer. An electron control layer may be disposed between the light emitting layer EL and the second electrode CE. The electron control layer may include an electron transport layer and may further include an electron injection layer. The hole control layer and the electron control layer may be commonly formed in the plural pixels using an open mask.

The encapsulation layer 140 may be disposed on the light emitting element layer 130. The encapsulation layer 140 may include an inorganic layer, an organic layer, and an inorganic layer, which are sequentially stacked, however, layers of the encapsulation layer 140 should not necessarily be limited thereto or thereby.

The inorganic layers may protect the light emitting element layer 130 from moisture and oxygen, and the organic layer may protect the light emitting element layer 130 from a foreign substance such as dust particles. The inorganic layers may include a silicon nitride layer, a silicon oxynitride layer, a silicon oxide layer, a titanium oxide layer, or an aluminum oxide layer. The organic layer may include an acrylic-based organic layer, however, it should not necessarily be limited thereto or thereby.

The input sensor IS may include a base layer 201, a first conductive layer 202, a sensing insulating layer 203, a second conductive layer 204, and a cover insulating layer 205.

The base layer 201 may be an inorganic layer that includes silicon nitride, silicon oxynitride, and/or silicon oxide. According to an embodiment, the base layer 201 may be an organic layer that includes an epoxy resin, an acrylic resin, or an imide-based resin. The base layer 201 may have a single-layer structure or a multi-layer structure of layers stacked in the third direction DR3.

Each of the first and second conductive layers 202 and 204 may have a single-layer structure or a multi-layer structure of layers stacked in the third direction DR3.

The conductive layer having the single-layer structure may include a metal layer or a transparent conductive layer. The metal layer may include molybdenum, silver, titanium, copper, aluminum, or alloys thereof. The transparent conductive layer may include a transparent conductive oxide, such as indium tin oxide (ITO), indium zinc oxide (IZO), zinc oxide (ZnO), indium zinc tin oxide (ITZO), or the like. In addition, the transparent conductive layer may include conductive polymer such as PEDOT, metal nanowire, graphene, or the like.

The conductive layer having the multi-layer structure may include metal layers. The metal layers may have a three-layer structure of titanium/aluminum/titanium. The conductive layer having the multi-layer structure may include at least one metal layer and at least one transparent conductive layer.

The sensing insulating layer 203 and/or the cover insulating layer 205 may include an inorganic layer. The inorganic layer may include aluminum oxide, titanium oxide, silicon oxide, silicon nitride, silicon oxynitride, zirconium oxide, and/or hafnium oxide.

The sensing insulating layer 203 and/or the cover insulating layer 205 may include an organic layer. The organic layer may include an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, and/or a perylene-based resin.

Figure 6:
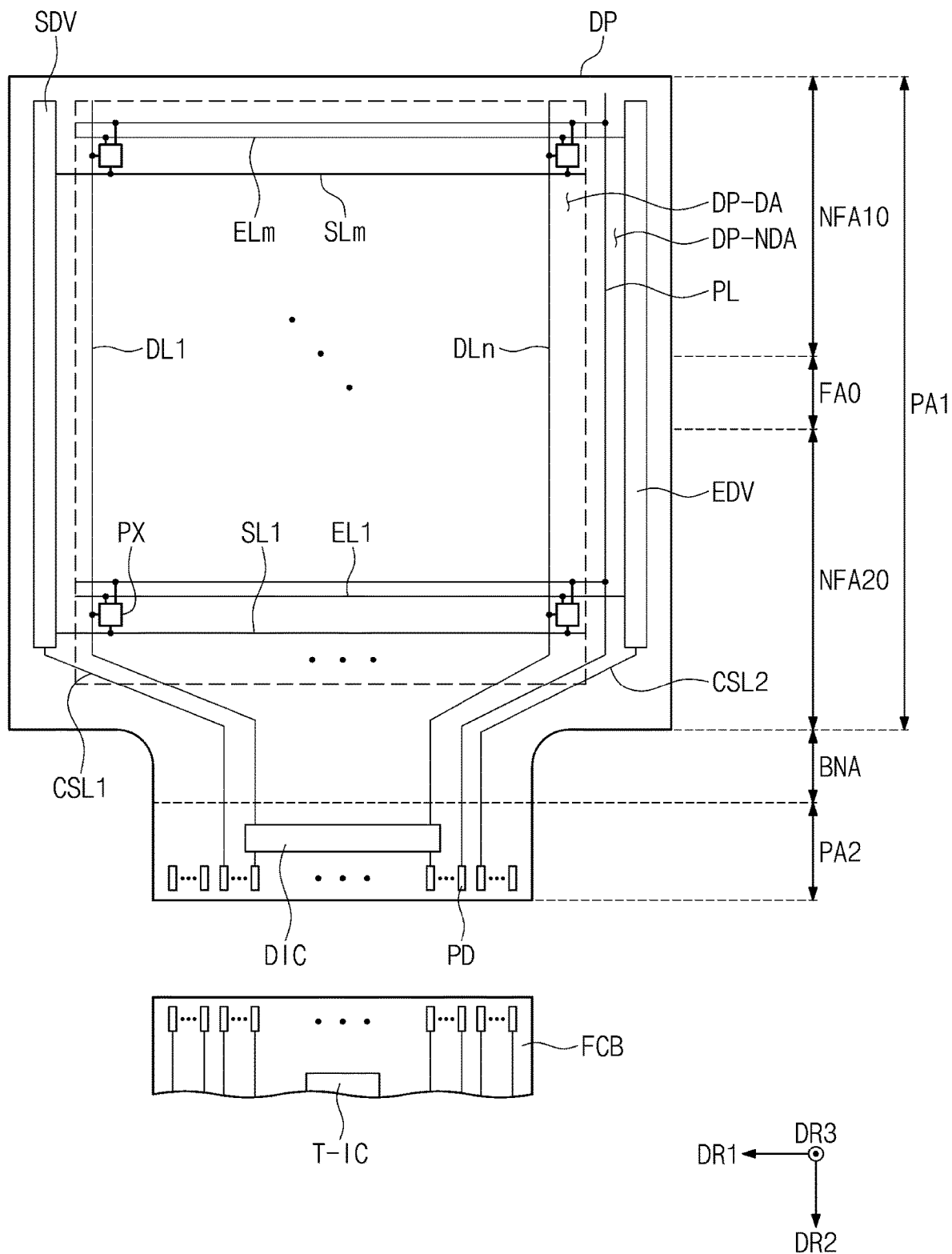
FIG. 6 is a plan view showing a display panel according to an embodiment of the present disclosure.

FIG. 6 is a plan view showing the display panel DP according to an embodiment of the present disclosure.

Referring to FIG. 6, the display panel DP may include the display area DP-DA and the non-display area DP-NDA at least partially surrounding the display area DP-DA. The display area DP-DA and the non-display area DP-NDA may be distinguished from each other by a presence or absence of the pixel PX. The pixel PX may be disposed in the display area DP-DA and omitted from the non-display area DP-NDA. A scan driver SDV, a data driver, and an emission driver EDV may be disposed in the non-display area NDA. The data driver may be a circuit provided in the driving chip DIC.

The display panel DP may include a first panel area PA1, a line area BNA, and a second panel area PA2, which are defined along the second direction DR2. The second panel area PA2 and the line area BNA may be areas of the non-display area DP-NDA. The line area BNA may be defined between the first panel area PA1 and the second panel area PA2.

The first panel area PA1 may correspond to the display surface DS of FIG. 1A. The first panel area PA1 may include a first non-folding area NFA10, a second non-folding area NFA20, and a folding area FA0. The first non-folding area NFA10, the second non-folding area NFA20, and the folding area FA0 may respectively correspond to the first non-folding area NFA1, the second non-folding area NFA2, and the folding area FA of FIGS. 1A and 1B.

A width (or a length) in the first direction DR1 of the line area BNA and a width (or a length) in the first direction DR1 of the second panel area PA2 may be smaller than a width (or a length) in the first direction DR1 of the first panel area PA1. An area having a relatively short length in a bending axis direction may be relatively easily bent.

The display panel DP may include a plurality of pixels PX, a plurality of scan lines SL1 to SLm, a plurality of data lines DL1 to DLn, a plurality of emission lines EL1 to ELm, first and second control lines CSL1 and CSL2, a power line PL, and a plurality of pads PD. In the present embodiment, each of m and n is a positive integer. The pixels PX may be connected to the scan lines SL1 to SLm, the data lines DL1 to DLn, and the emission lines EL1 to ELm.

The scan lines SL1 to SLm may extend in the first direction DR1 and may be electrically connected to the scan driver SDV. The data lines DL1 to DLn may extend in the second direction DR2 and may be electrically connected to the driving chip DIC via the line area BNA. The emission lines EL1 to ELm may extend in the first direction DR1 and may be electrically connected to the emission driver EDV.

The power line PL may include a portion extending in the first direction DR1 and a portion extending in the second direction DR2. The portion extending in the first direction DR1 and the portion extending in the second direction DR2 may be disposed on different layers from each other. The portion of the power line PL, which extends in the second direction DR2, may extend to the second panel area PA2 via the line area BNA. The power line PL may provide a first voltage to the pixels PX.

The first control line CSL1 may be connected to the scan driver SDV and may extend to a lower end of the second panel area PA2 via the line area BNA. The second control line CSL2 may be connected to the emission driver EDV and may extend to the lower end of the second panel area PA2 via the line area BNA.

The pads PD may be disposed adjacent to the lower end of the second panel area PA2. The driving chip DIC, the power line PL, the first control line CSL1, and the second control line CSL2 may be electrically connected to the pads PD. The circuit film FCB may be electrically connected to the pads PD through an anisotropic conductive adhesive layer.

Figure 7:
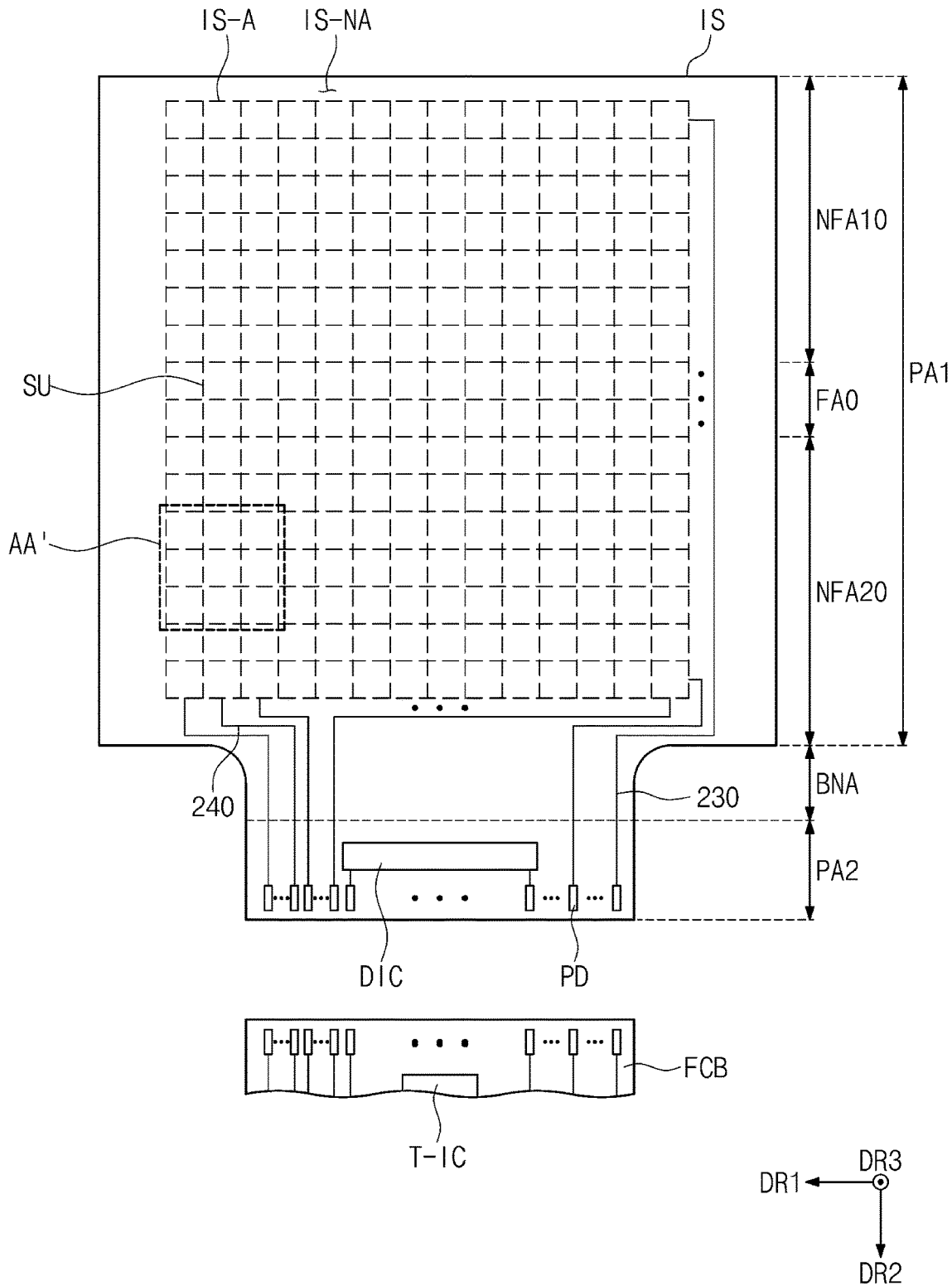
FIG. 7 is a plan view showing an input sensor according to an embodiment of the present disclosure.
Figure 8A:
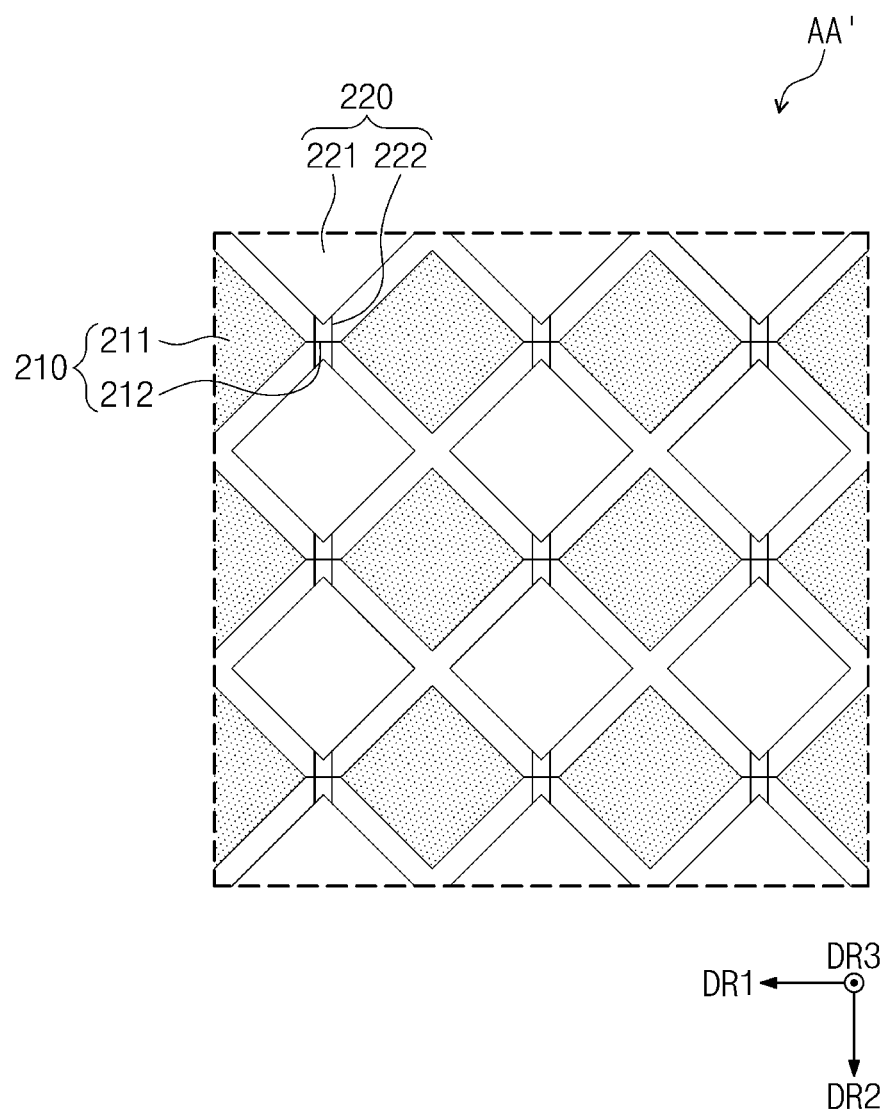
FIGS. 8A and 8B are enlarged views showing an area AA' shown in FIG. 7.
Figure 8B:
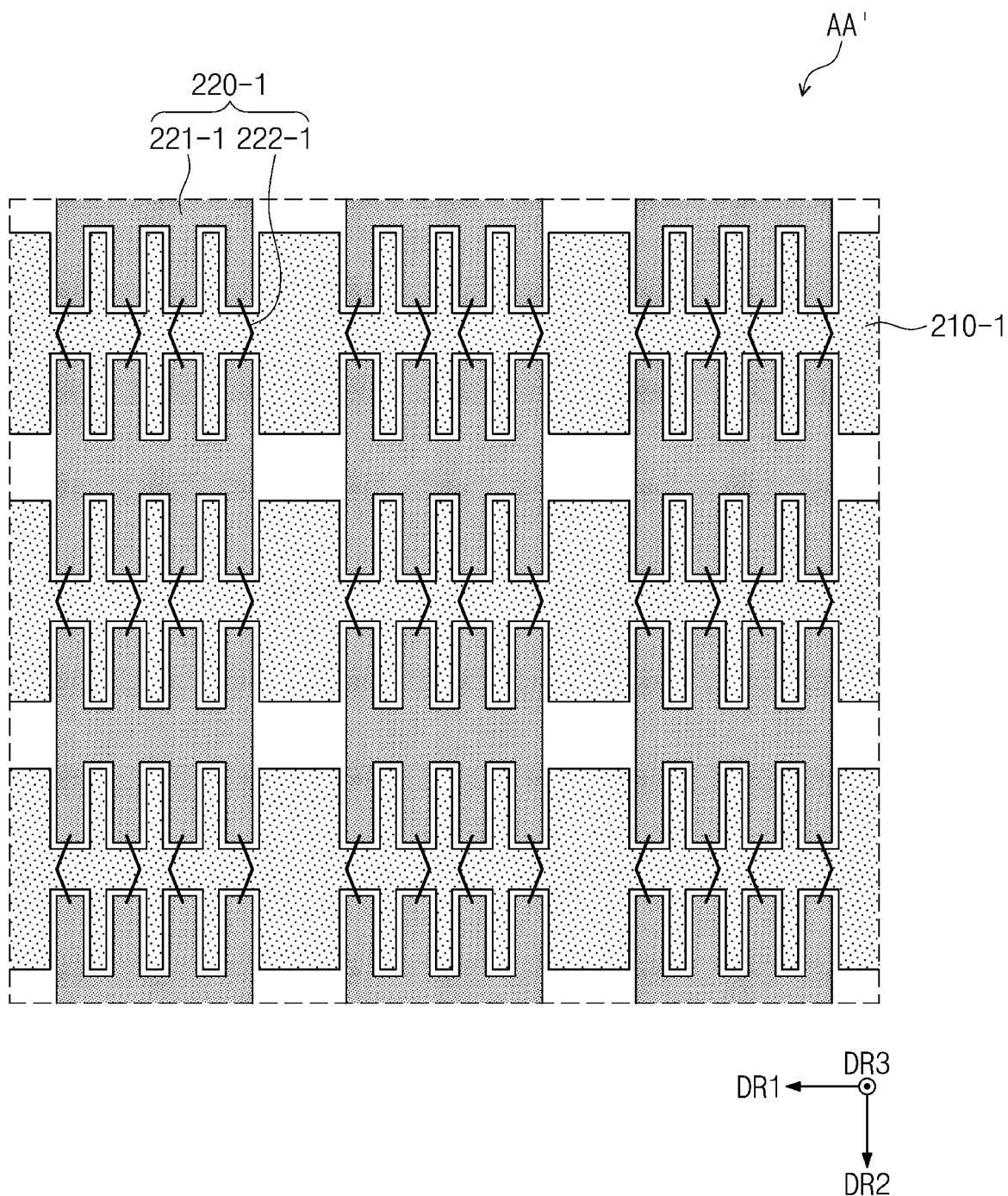

FIG. 7 is a plan view showing the input sensor IS according to an embodiment of the present disclosure. FIGS. 8A and 8B are enlarged plan views showing an area AA' shown in FIG. 7.

The input sensor IS may include a sensing area IS-A and a peripheral area IS-NA, which are defined therein. The sensing area IS-A may be activated in response to electrical signals. As an example, the sensing area IS-A may be an area in which the external input is sensed. The peripheral area IS-NA may be defined adjacent to the sensing area IS-A and may at least partially surround the sensing area IS-A.

The input sensor IS may include electrodes 210, crossing electrodes 220, first sensing lines 230, and second sensing lines 240. The electrodes 210 and the crossing electrodes 220 may be disposed in the sensing area IS-A, and the first sensing lines 230 and the second sensing lines 240 may be disposed in the peripheral area IS-NA.

The input sensor IS may obtain information about the external input based on a variation in mutual capacitance between the electrodes 210 and the crossing electrodes 220. In addition, the input sensor IS may sense the input from the input device PN (refer to FIG. 3) that provides an output signal based on the electromagnetic resonance method.

The input sensor IS may include a plurality of sensing units SU. Each of the sensing units SU may be defined in an area where one electrode 210 among the electrodes 210 crosses one crossing electrode 220 among the crossing electrodes 220.

Each of the electrodes 210 may extend in the first direction DR1, and the electrodes 210 may be arranged in the second direction DR2. The electrodes 210 may include first portions 211 and a second portion 212. The second portion 212 may be disposed adjacent to two first portions 211 adjacent to each other.

The crossing electrodes 220 may be arranged in the first direction DR1, and each of the crossing electrodes 220 may extend in the second direction DR2. The crossing electrodes 220 may include patterns 221 and connection patterns 222 (or bridge patterns). The connection patterns 222 may electrically connect two patterns 221 adjacent to each other. The two patterns 221 adjacent to each other may be connected to each other by two connection patterns 222, however, they should not necessarily be limited thereto or thereby. The second portion 212 may be insulated from two connection patterns 222 while crossing the two connection patterns 222.

The patterns 221, the first portions 211, and the second portions 212 may be disposed on the same layer, and the connection patterns 222 may be disposed on a layer different from the layer on which the patterns 221, the first portions 211, and the second portions 212 are disposed. As an example, the patterns 221, the first portions 211, and the second portions 212 may be included in the second conductive layer 204 (refer to FIG. 5), the connection patterns 222 may be included in the first conductive layer 202 (refer to FIG. 5), and this structure may be called a bottom bridge structure. However, the present disclosure should not necessarily be limited thereto or thereby. As an example, the patterns 221, the first portions 211, and the second portions 212 may be included in the first conductive layer 202 (refer to FIG. 5), the connection patterns 222 may be included in the second conductive layer 204 (refer to FIG. 5), and this structure may be called a top bridge structure.

The shape and the arrangement of the electrodes 210 and the crossing electrodes 220 shown in FIG. 8A are merely examples, and the shape and the arrangement of the electrodes 210 and the crossing electrodes 220 should not necessarily be limited to those of FIG. 8A.

The first sensing lines 230 and the second sensing lines 240 may be electrically connected to corresponding pads among the pads PD.

The first sensing lines 230 may be electrically connected to the electrodes 210, respectively. As an example, the first sensing lines 230 may be respectively connected to right sides of the electrodes 210, however, this is merely one example. According to an embodiment, some first sensing lines among the first sensing lines 230 may be respectively connected to left sides of some electrodes among the electrodes 210, and the other first sensing lines among the first sensing lines 230 may be respectively connected to right sides of the other electrodes among the electrodes 210. The second sensing lines 240 may be respectively connected to lower sides of the electrodes 210, however, this is merely one example. According to an embodiment, some of the second sensing lines may be connected to the lower sides of the electrodes 210, and the other of the second sensing lines may be connected to upper sides of the electrodes 210. For example, one electrode 210 may be connected in a double routing structure.

A driving circuit T-IC may be electrically connected to the input sensor IS and may control an operation of the input sensor IS. The driving circuit T-IC may be mounted on the circuit film FCB. The driving circuit T-IC may be electrically connected to the first sensing lines 230 and the second sensing lines 240.

The driving circuit T-IC may sense not only the touch by the user but also the input by the input device PN (refer to FIG. 3) through the input sensor IS. For example, the driving circuit T-IC may calculate not only input coordinates based on the variation in mutual capacitance between the electrode 210 and the crossing electrode 220 but also input coordinates of the input by the input device PN (refer to FIG. 3) that provides the output signal based on the electromagnetic resonance method.

FIG. 8B is an enlarged plan view showing the area AA' of FIG. 7 according to an embodiment of the present disclosure.

FIG. 8B shows electrodes 210-1 and crossing electrodes 220-1, which have different shapes from those of FIG. 8A. The electrodes 210-1 and the crossing electrodes 220-1 may have a bar shape.

Each of the electrodes 210-1 may extend in the first direction DR1, and the electrodes 210-1 may be arranged in the second direction DR2. The crossing electrodes 220-1 may be arranged in the first direction DR1, and each of the crossing electrodes 220-1 may extend in the second direction DR2. The crossing electrodes 220-1 may include patterns 221-1 and connection patterns 222-1 (or bridge patterns). The connection patterns 222-1 may electrically connect two patterns 221-1 adjacent to each other. The two patterns 221-1 adjacent to each other may be connected to each other by two connection patterns 222-1, however, they should not necessarily be limited thereto or thereby. One electrode 210-1 may be insulated from two connection patterns 222-1 while crossing the two connection patterns 222-1. FIG. 8B shows a shape in which the electrodes 210-1 are engaged with the patterns 221-1 as a representative example, however, the shape of the electrodes 210-1 and the patterns 221-1 should not necessarily be limited thereto or thereby.

Each of the electrodes 210 or 210-1 and the crossing electrodes 220 or 220-1, which are described with reference to FIGS. 8A and 81, may have a mesh structure. In this case, each of the electrodes 210 or 210-1 and the crossing electrodes 220 or 220-1 may be provided with an opening, however, they should not necessarily be limited thereto or thereby. According to an embodiment, each of the electrodes 210 or 210-1 and the crossing electrodes 220 or 220-1 may be a transparent electrode through which no opening is defined.

Figure 9A:
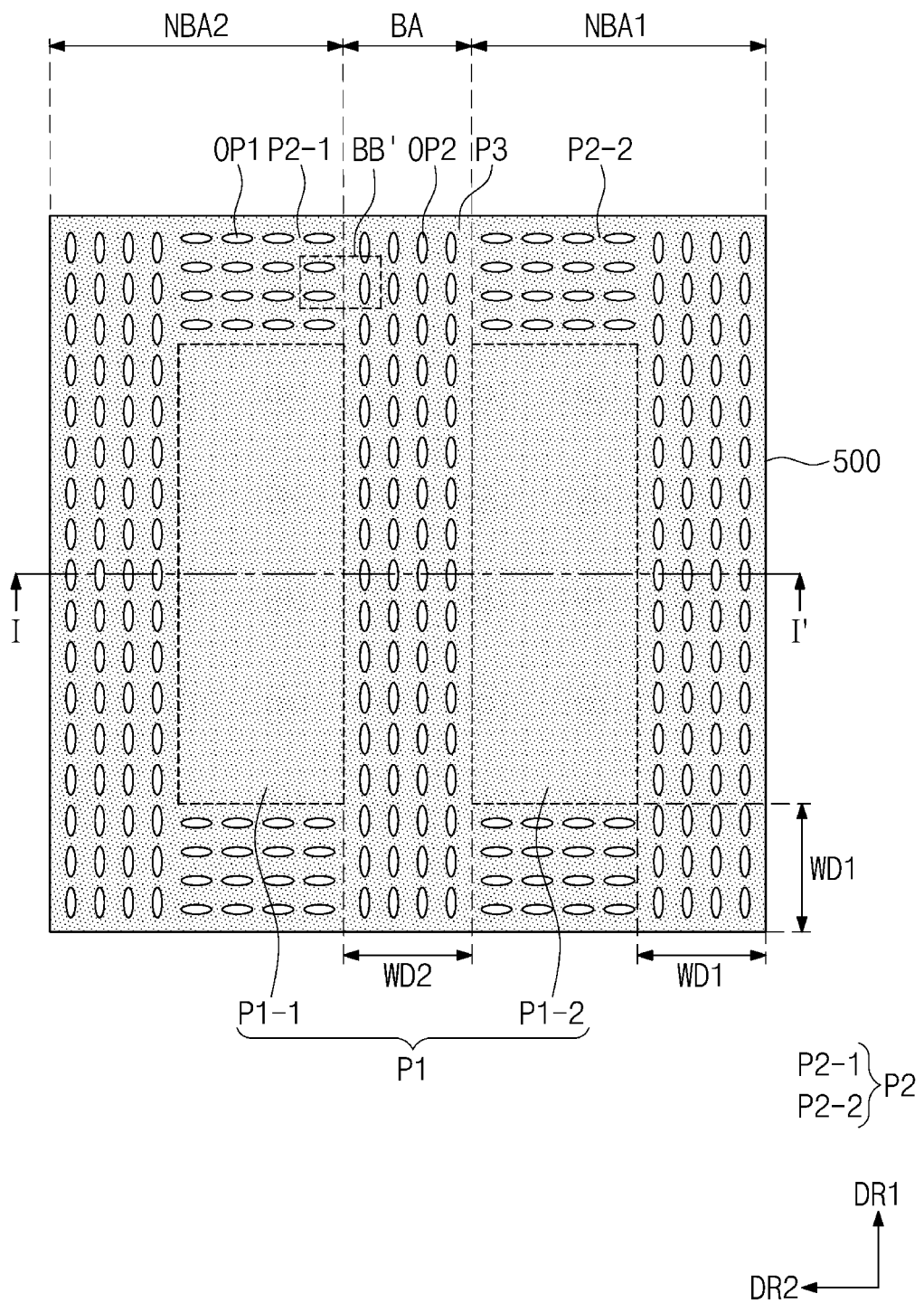
FIG. 9A is a plan view showing a support according to an embodiment of the present disclosure.
Figure 9B:
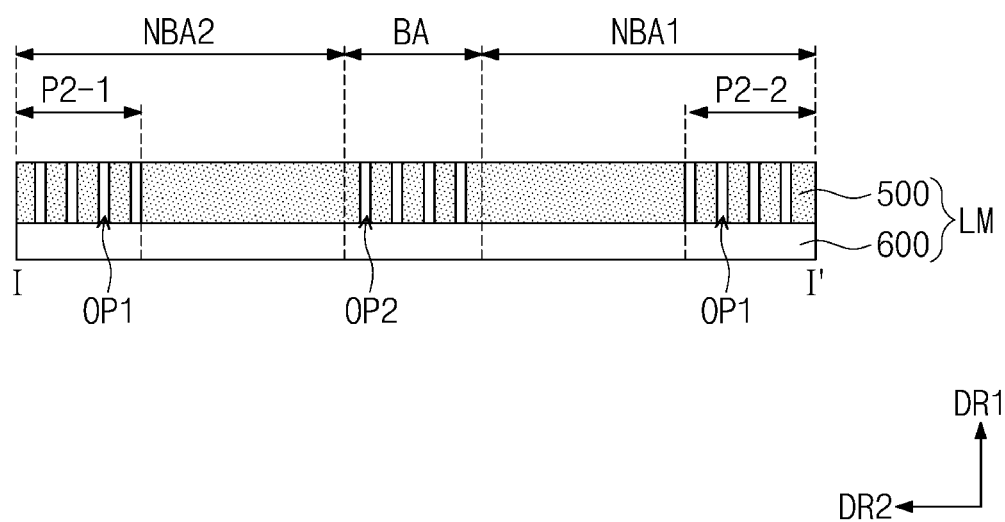
FIG. 9B is a cross-sectional view showing a support according to an embodiment of the present disclosure.

FIG. 9A is a plan view showing the support structure 500 according to an embodiment of the present disclosure. FIG. 9B is a cross-sectional view showing the support structure 500 according to an embodiment of the present disclosure.

Referring to FIGS. 9A and 9B, the support structure 500 may include a first portion P1, a second portion P2, and a third portion P3. The support structure 500 may include a bending area BA, a first non-bending area NBA1, and a second non-bending area NBA2, which are defined therein. The bending area BA may correspond to the folding area FA (refer to FIG. 4), the first non-bending area NBA1 may correspond to the first non-folding area NFA1, and the second non-bending area NBA2 may correspond to the second non-folding area NFA2.

The first portion P1 and the second portion P2 may be disposed in the first and second non-bending areas NBA1 and NBA2. The third portion P3 may be disposed in the bending area BA.

The second portion P2 may at least partially surround the first portion P1. For example, the second portion P2 may be defined at an edge area of the support structure 500. The first portion P1 may correspond to a center portion surrounded by the second portion P2.

The openings might not be defined in the first portion P1. The first portion P1 may include a portion P1-2 disposed in the first non-bending area NBA1 and a portion P1-1 disposed in the second non-bending area NBA2. For example, the first portion P1 might not be disposed in the bending area BA.

The second portion P2 may be disposed at the edge area of the support structure 500. The second portion P2 may include a portion P2-1 disposed in the second non-bending area NBA2 and a portion P2-2 disposed in the first non-bending area NBA1. The second portion P2 may be provided with a plurality of first openings OP1. Each of the first openings OP1 may be defined through the support structure 500 that is the metal plate. The shape, the arrangement, and the number of the first openings OP1 should not necessarily be limited thereto or thereby.

The third portion P3 may include a plurality of second openings OP2 defined therethrough. The second openings OP2 may be spaced apart from each other to define a lattice structure. The third portion P3 may be disposed in the bending area BA and may be bent. The lattice structure defined by the second openings OP2 may increase flexibility when the third portion P3 is bent. Accordingly, the electronic device ED may be easily folded.

The shape of the second openings OP2 should not necessarily be limited to that shown in drawings. The second openings OP2 have an oval shape in FIG. 9A, however, they should not necessarily be limited thereto or thereby. According to an embodiment, the second openings OP2 may have other shapes and may be arranged irregularly. The number of the second openings OP2 should not necessarily be limited to that shown in drawings. The shape of the second openings OP2 may be substantially the same as that of the first openings OP1. The first openings OP1 and the second openings OP2 may be formed through the same process (e.g., they may be formed together in a single step). The third portion P3 may have a width WD2 that is the same as a width WD1 of the second portion P2.

Figure 10:
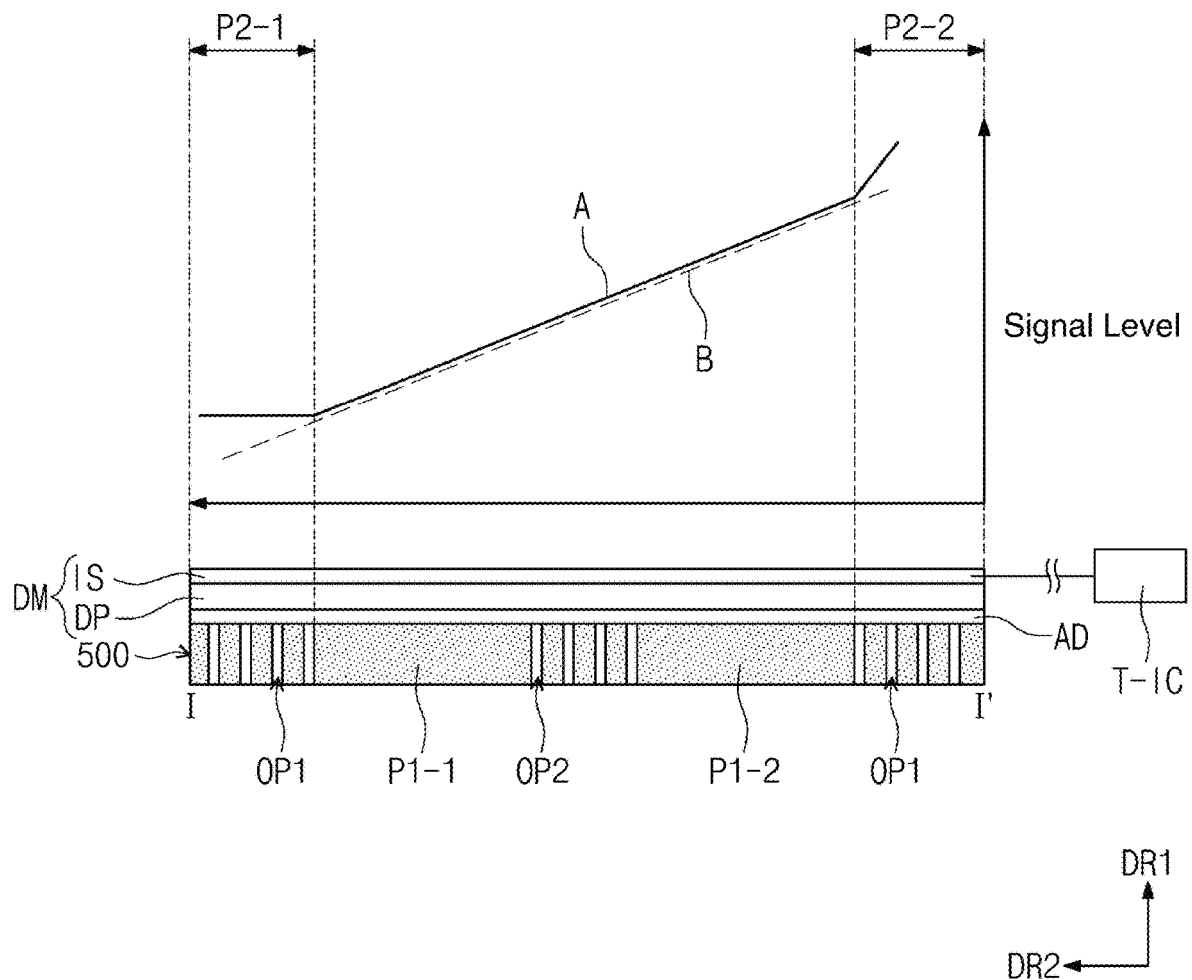
FIG. 10 is a view showing a signal level according to an embodiment of the present disclosure.

FIG. 10 shows a level of a signal according an arrangement between the input sensor IS, the support structure 500, and the driving circuit T-IC.

According to the present embodiment, the second portion P2 may include the first openings OP1 defined therethrough, and thus, the signal level of the external input sensed by the input sensor IS may increase. For example, the second portion P2 of the support structure 500 may include the first openings OP1 defined therethrough to compensate for a signal reduction caused by the metal plate. For example, since a magnetic flux of the external signal is maintained through the first openings OP1 in the second portion P2, the signal level in the second portion P2 may be greater than that of the portions P1-1 and P1-2 of the first portion P1.

Referring to FIG. 10, the display panel DP and the input sensor IS disposed on the display panel DP may be supported by the support structure 500. For example, the support structure 500 may overlap the display panel DP and the input sensor IS in a thickness direction. An adhesive layer AD may be disposed between the display panel DP and the support structure 500. The driving circuit T-IC may be connected to one side of the input sensor IS.

In FIG. 10, an edge area of the input sensor IS may be farther away from the driving circuit T-IC. The signal level in the edge area of the input sensor IS disposed farther from the driving circuit T-IC may be small. The portions P2-1 and P2-2 of the second portion P2 of the support structure 500 overlapping the edge area of the input sensor IS may include the first openings OP1 to compensate for the signal level.

In FIG. 10, the portion P2-1 of the second portion P2 may be disposed farther from the driving circuit T-IC than the portion P2-2 and the portions PI-1 and P1-2 of the first portion P1 are. The signal level of a portion of the input sensor IS, which overlaps the portion P2-1 disposed farther from the driving circuit T-IC, may be the smallest. The first openings OP1 of the support structure 500 may compensate for the signal attenuated due to the support structure 500. From a graph of FIG. 10, it may be seen that the signal level of an embodiment example A is greater than that of a comparative example B in areas overlapping the portions P2-1 and P2-2 of the second portion P2.

The arrangement of the driving circuit T-IC shown in FIG. 10 is merely one example. According to an embodiment, the driving circuit T-IC may be connected to the input sensor IS at a variety of positions farther away from the second portion P2 surrounding the first portion P1.

Figure 11:
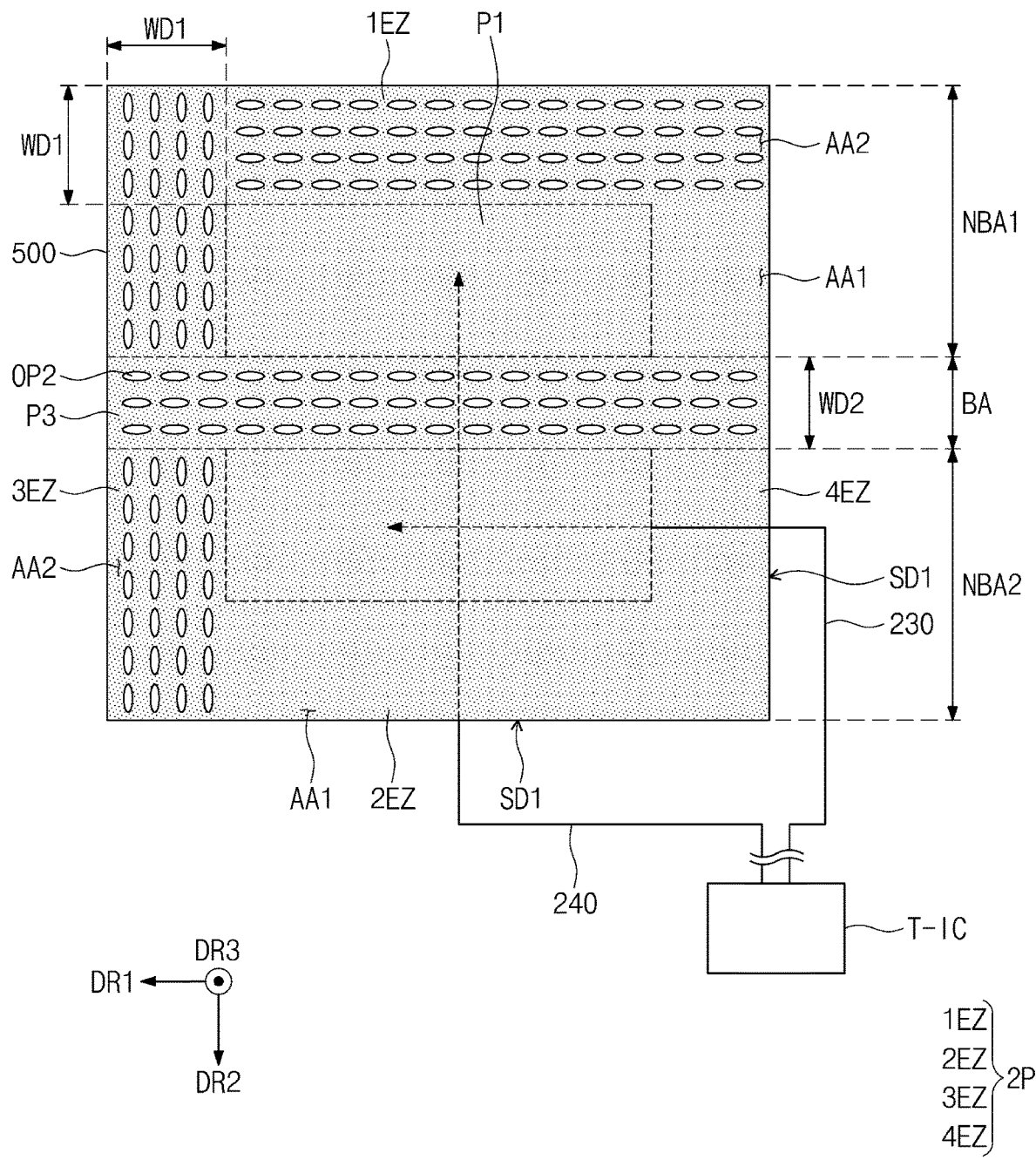
FIG. 11 is a plan view showing a support according to an embodiment of the present disclosure.

FIG. 11 is a plan view showing a support structure 500 according to an embodiment of the present disclosure.

Referring to FIG. 11, a second portion P2 may include a first area AA1 and a second area AA2. For example, the second portion P2 may at least partially surround a first portion P1 and may include the first area AA1 through which first openings OP1 are not defined and the second area AA2 through which the first openings OP1 are defined.

In FIG. 11, a driving circuit T-IC may be connected to a first side portion SD1 of the input sensor IS (refer to FIG. 10). The driving circuit T-IC may be connected to one side of the input sensor IS as shown in FIG. 10, and a first sensing line 230 and a second sensing line 240, which are connected to the first side portion SD1, may transmit signals from the driving circuit T-IC to the input sensor IS in FIG. 11.

The support structure 500 may overlap the input sensor IS. The signals from the driving circuit T-IC may be propagated from the first area AA1 closer to the first side portion SD1 to the second area AA2 farther from the first side portion SD1 via the first sensing line 230 and the second sensing line 240 in the input sensor IS. A level of the signals may decrease as a distance from the second area AA2 decreases. In the present embodiment, the first openings OP1 may be defined in the second area AA2 that is not adjacent to the driving circuit T-IC, and thus, the signal in the input sensor may be compensated for.

A third portion P3 may include second openings OP2 and may be disposed in a bending area BA, and the third portion P3 may have a width WD2 smaller than a width WD1 of the second portion P2. For example, the number of the openings included in the second portion P2 may be greater than the number of the openings included in the third portion P3.

According to an embodiment, the second portion P2 may include a first edge 1EZ, a second edge 2EZ, a third edge 3EZ, and a fourth edge 4EZ. The first edge 1EZ and the second edge 2EZ may be substantially parallel to the third portion P3. The first edge 1EZ may be disposed in a first non-bending area NBA1, and the second edge 2EZ may be disposed in a second non-bending area NBA2. The third edge 3EZ and the fourth edge 4EZ may be substantially perpendicular to the third portion P3. According to an embodiment, the second edge 2EZ and the fourth edge 4EZ may be disposed adjacent to the first side portion SD1, and the first edge 1EZ and the third edge 3EZ may be disposed not to be adjacent to the first side portion SD1. The first edge 1EZ and the third edge 3EZ may be provided with the first openings OP1 defined therethrough.

Figure 12:
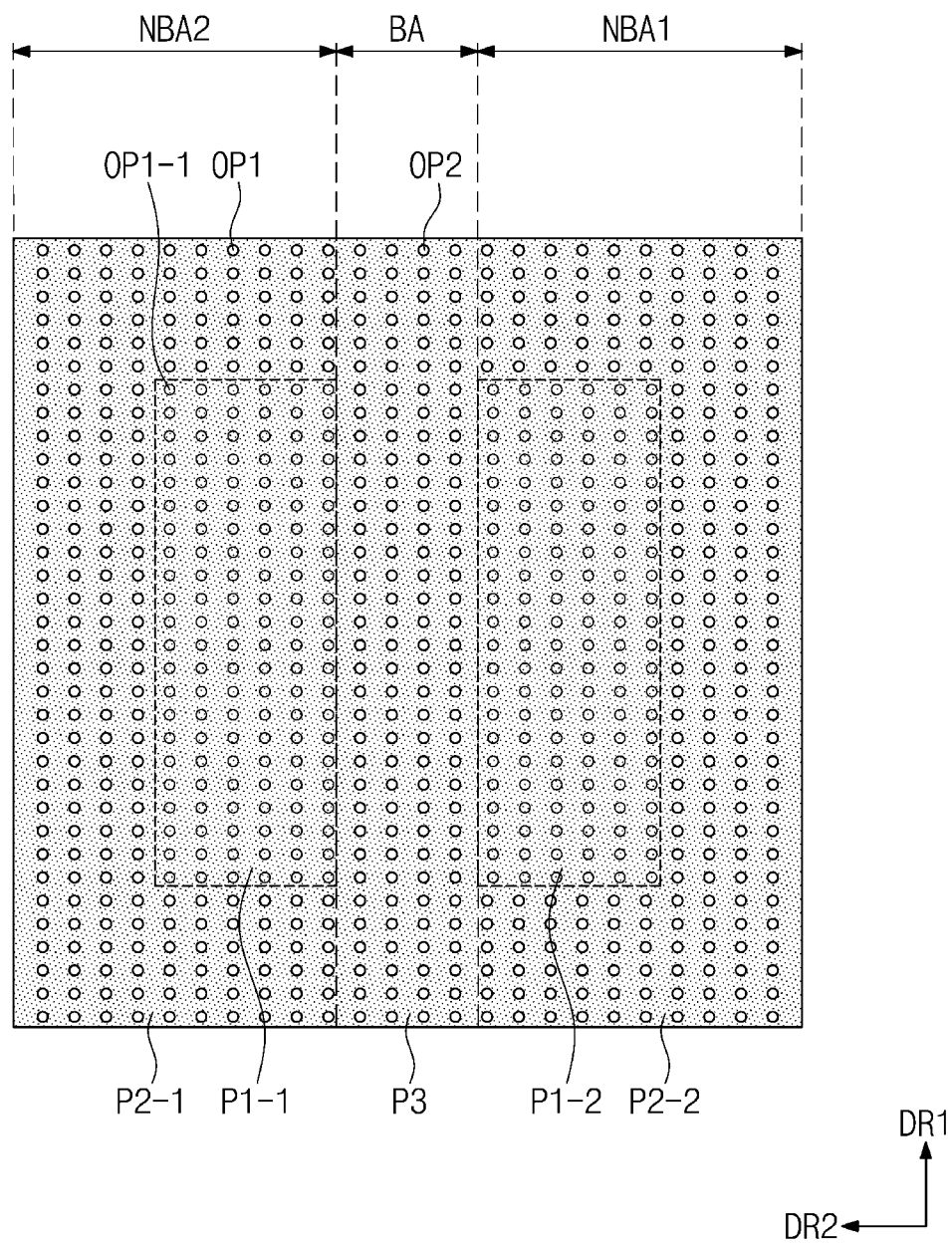
FIG. 12 is a plan view showing a support according to an embodiment of the present disclosure.

FIG. 12 is a plan view showing a support structure 500 according to an embodiment of the present disclosure.

Referring to FIG. 12, a first portion P1-1, P1-2, a second portion P2-1, P2-2, and a third portion P3 of the support structure 500 may be provided with a plurality of openings defined therethrough. As an example, first openings OP1-1 may be defined through the first portion P1-1, P1-2. For example, the openings may be entirely defined over the support structure 500.

According to an embodiment, the number of the first openings OP1-1 defined in the first portion P1 per unit area may be smaller than the number of the first openings OP1 defined in the second portion P2 per unit area. For example, a density of the first openings OP1-1 in the first portion P1 may be smaller than a density of the first openings OP1 in the second portion P2.

According to an embodiment, a density of the second openings OP2 in the third portion P3 may be greater than the density of the first openings OP1 in the second portion P2. The first opening OP1 may have a size and a shape, which are different from those of the second opening OP2. The arrangement, the size, and the shape of the first and second openings OP1 and OP2 of FIG. 12 are merely examples, and they should not necessarily be particularly limited.

FIGS. 13A to 13D are views showing openings according to embodiments of the present disclosure. FIGS. 13A to 13D are enlarged plan views showing an area BB' of FIG. 9A.

FIG. 13A to 13D show first openings OP1 having different shapes from each other.

Figure 13A:
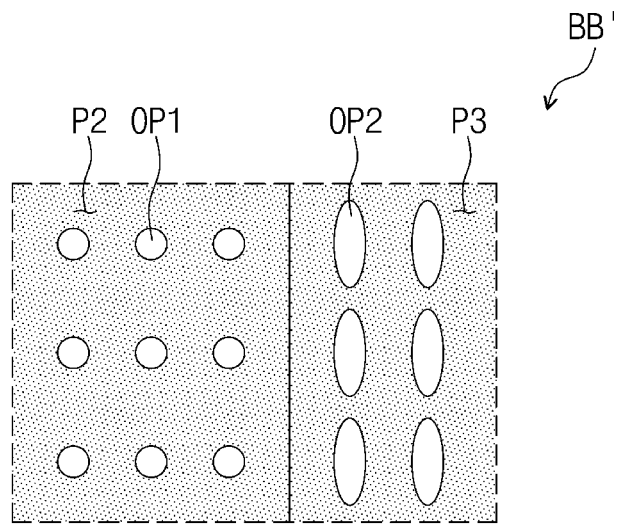
FIGS. 13A to 13D are views showing openings according to embodiments of the present disclosure.

Referring to FIG. 13A, the first openings OP1 of a second portion P2 may have a circular shape. Second openings OP2 of a third portion P3 may have an oval shape. The first openings OP1 may be arranged regularly. The first openings OP1 having the circular shape may have substantially the same size.

Figure 13B:
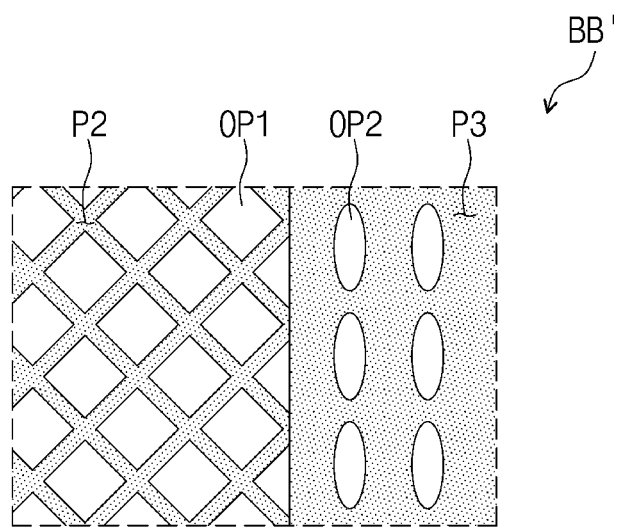

Referring to FIG. 13B, a second portion P2 may have a mesh pattern (e.g., such as a screen pattern). According to the present embodiment, first openings OP1 may correspond to a mesh opening. The first openings OP1 may have a regular and constant shape.

Figure 13C:
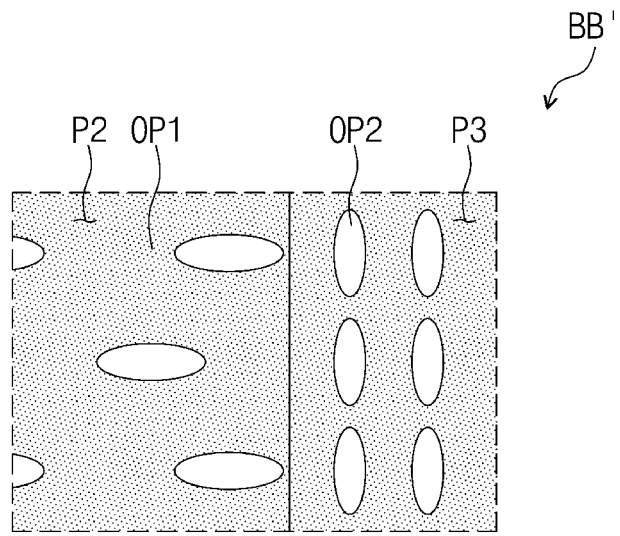

Referring to FIG. 13C, first openings OP1 of a second portion P2 may have an oval shape and may be irregularly arranged. The first openings OP1 may have substantially the same oval shape as second openings OP2. The second openings OP2 may be regularly arranged, however, the first openings OP1 may be arranged irregularly and relatively sparsely.

Figure 13D:
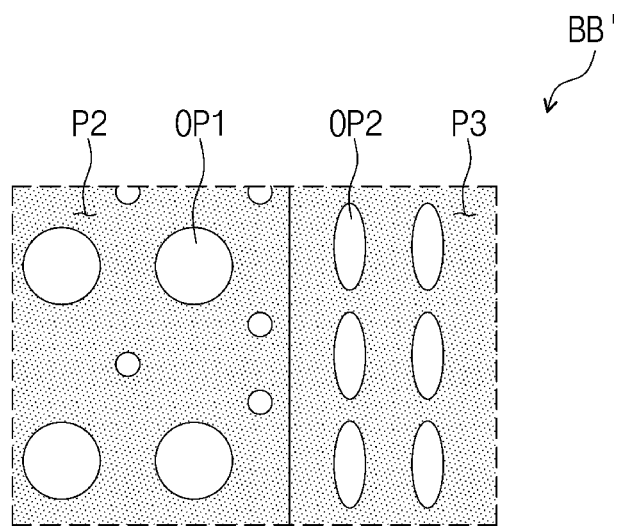

Referring to FIG. 13D, first openings OP1 may have different sizes from each other. As an example, the first openings OP1 may have a circular shape and may have different sizes from each other. For example, the first openings OP1 may correspond to circular holes that are irregularly arranged and have different sizes from each other. The holes having different sizes from each other of the first openings OP1 should not necessarily be limited to the circular shape of FIG. 13D, and according to an embodiment, the holes may have an angled shape.

Second openings OP2 of a third portion P3 are required to have a uniform shape for the flexibility of the bending area BA (refer to FIG. 12). However, the first openings OP1 of the second portion P2 may be used to compensate for the input signal, and thus, the size, the shape, and the arrangement of the first openings OP1 should not necessarily be particularly limited thereto.

Although the embodiments of the present disclosure have been described, it is understood that the present disclosure should not necessarily be limited to these embodiments but various changes and modifications can be made by one ordinary skilled in the art within the spirit and scope of the present disclosure. Therefore, the disclosed subject matter should not necessarily be limited to any single embodiment described herein.

What is claimed is:

1. An electronic device, comprising:
a display panel;
an input sensor disposed on the display panel; and
a support disposed under the display panel and supporting the display panel, the support comprising:
a first portion that is without openings; and
a second portion that fully surrounds the first portion in a plan view, wherein the second portion includes a plurality of first openings defined therethrough and regularly arranged.

2. The electronic device of claim 1, wherein the display panel comprises a folding area and a non-folding area, the support comprises a bending area overlapping the folding area and a non-bending area overlapping the non-folding area, and the first portion and the second portion are each disposed in the non-bending area.

3. The electronic device of claim 2, wherein the support further comprises a third portion disposed in the bending area, the third portion including a plurality of second openings defined therethrough.

4. The electronic device of claim 3, wherein each of the first openings has a shape that is the same as a shape of each of the second openings.

5. The electronic device of claim 3, wherein the second portion has a width that is the same as a width of the third portion.

6. The electronic device of claim 3, wherein the second portion comprises:
first and second edges each disposed substantially parallel to the third portion, the first and second edges being disposed at sides opposite to each other, and the first and second edges being symmetrical to each other; and
third and fourth edges each disposed substantially perpendicular to the third portion, the third and fourth edges being disposed at sides opposite to each other, and the third and fourth edges being symmetrical to each other.

7. The electronic device of claim 6, wherein the first openings are defined through at least a portion of the first edge, the second edge, the third edge, and the fourth edge.

8. The electronic device of claim 1, wherein the support comprises a non-metal material having an electrical conductivity that is lower than an electrical conductivity of a metal material.

9. The electronic device of claim 1, wherein the first openings have different shapes from each other.

10. The electronic device of claim 1, further comprising a driving circuit electrically connected to the input sensor and driving the input sensor, wherein at least a portion of the second portion is disposed farther from the driving circuit than the first portion is.

11. The electronic device of claim 1, wherein the support comprises a metal material.

12. The electronic device of claim 1, wherein the input sensor is disposed directly on the display panel.

13. The electronic device of claim 1, wherein the first openings are defined through the first portion.

14. The electronic device of claim 13, wherein a number of the first openings in the first portion, per unit area, is smaller than a number of the first openings in the second portion, per unit area.

15. An electronic device, comprising:
a display panel;
an input sensor disposed on the display panel;
a driving circuit connected to a first side of the input sensor and driving the input sensor; and
a support disposed under the display panel and comprising a first portion and a second portion that fully surrounds the first portion in a plan view, the second portion comprising:
a first area adjacent to the first side, the first area not including openings; and
a second area that is spaced apart from the first side, wherein the second area includes a plurality of first openings that are regularly arranged.

16. The electronic device of claim 15, wherein the second area is disposed farther from the driving circuit than the first area is.

17. The electronic device of claim 15, wherein the display panel comprises a folding area and a non-folding area, the support comprises a bending area at least partially overlapping the folding area and a non-bending area at least partially overlapping the non-folding area, and the support further comprises a third portion disposed in the bending area and including a plurality of second openings defined therethrough.

18. The electronic device of claim 17, wherein the second portion has a width that is greater than a width of the third portion.

19. The electronic device of claim 15, wherein the first openings have different shapes from each other.

20. The electronic device of claim 15, wherein the input sensor is disposed directly on the display panel, and the support entirely overlaps the input sensor.

21. The electronic device of claim 3, wherein the first portion includes two distinct areas that are separated from one another by the third portion.

22. The electronic device of claim 21, wherein the second portion and the third portion together have a double-frame shape.

23. An electronic device, comprising:
a display panel;
a support disposed under the display panel; and
an input sensor disposed over the display panel with the display panel being disposed between the input sensor and the support,
wherein a plurality of openings is defined as a frame around four sides of the support, in a plan view, the plurality of openings being regularly arranged.

24. The electronic device of claim 23, wherein the support is metal.

* * * * *